United States Patent
Iida et al.

(10) Patent No.: US 7,931,502 B2
(45) Date of Patent: Apr. 26, 2011

(54) CARD EDGE CONNECTOR AND METHOD FOR ASSEMBLING THE SAME

(75) Inventors: Taku Iida, Nagoya (JP); Takashi Kamiya, Okazaki (JP); Yoshio Hironaka, Nukata-gun (JP); Toshihiro Miyake, Inuyama (JP); Masashi Hori, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/801,406

(22) Filed: Jun. 8, 2010

(65) Prior Publication Data

US 2011/0021078 A1 Jan. 27, 2011

(30) Foreign Application Priority Data

Jul. 24, 2009 (JP) .................... 2009-173421

(51) Int. Cl.
H01R 24/00 (2006.01)
(52) U.S. Cl. ..................... 439/630
(58) Field of Classification Search .......... 439/630, 439/637
See application file for complete search history.

(56) References Cited

U.S. PATENT DOCUMENTS

| | | | |
|---|---|---|---|
| 5,163,847 A | 11/1992 | Regnier | |
| 5,409,385 A * | 4/1995 | Tan et al. | 439/76.1 |
| 6,325,659 B1 * | 12/2001 | Heinzen et al. | 439/404 |
| 6,832,933 B2 * | 12/2004 | Bu et al. | 439/637 |
| 7,628,654 B2 | 12/2009 | Hori et al. | |

FOREIGN PATENT DOCUMENTS

| | | |
|---|---|---|
| JP | U-S54-045958 | 3/1979 |
| JP | U-05-043489 | 6/1993 |
| JP | U-06-086366 | 12/1994 |
| JP | U-3024494 | 2/1996 |

* cited by examiner

*Primary Examiner* — Gary F. Paumen
(74) *Attorney, Agent, or Firm* — Posz Law Group, PLC

(57) ABSTRACT

A card edge connector for electrically coupling between contact electrodes on an electric circuit board and harnesses includes: a housing with a board insertion opening; harness terminals coupling with the harnesses; and junction terminals coupling between contact electrodes and harness terminals. The contact electrodes include first and second contact electrodes on both of first and second surfaces of the board. Each first contact electrode is nearer one end of the board than each second contact electrode. The first and second contact electrodes on the first or second surface are aligned alternately along with a width direction of the board. A first or second end of the junction terminal contacting the contact electrode on the first or second surface extends from a first or second inner wall of the board insertion opening to reach a centerline of the board.

14 Claims, 11 Drawing Sheets

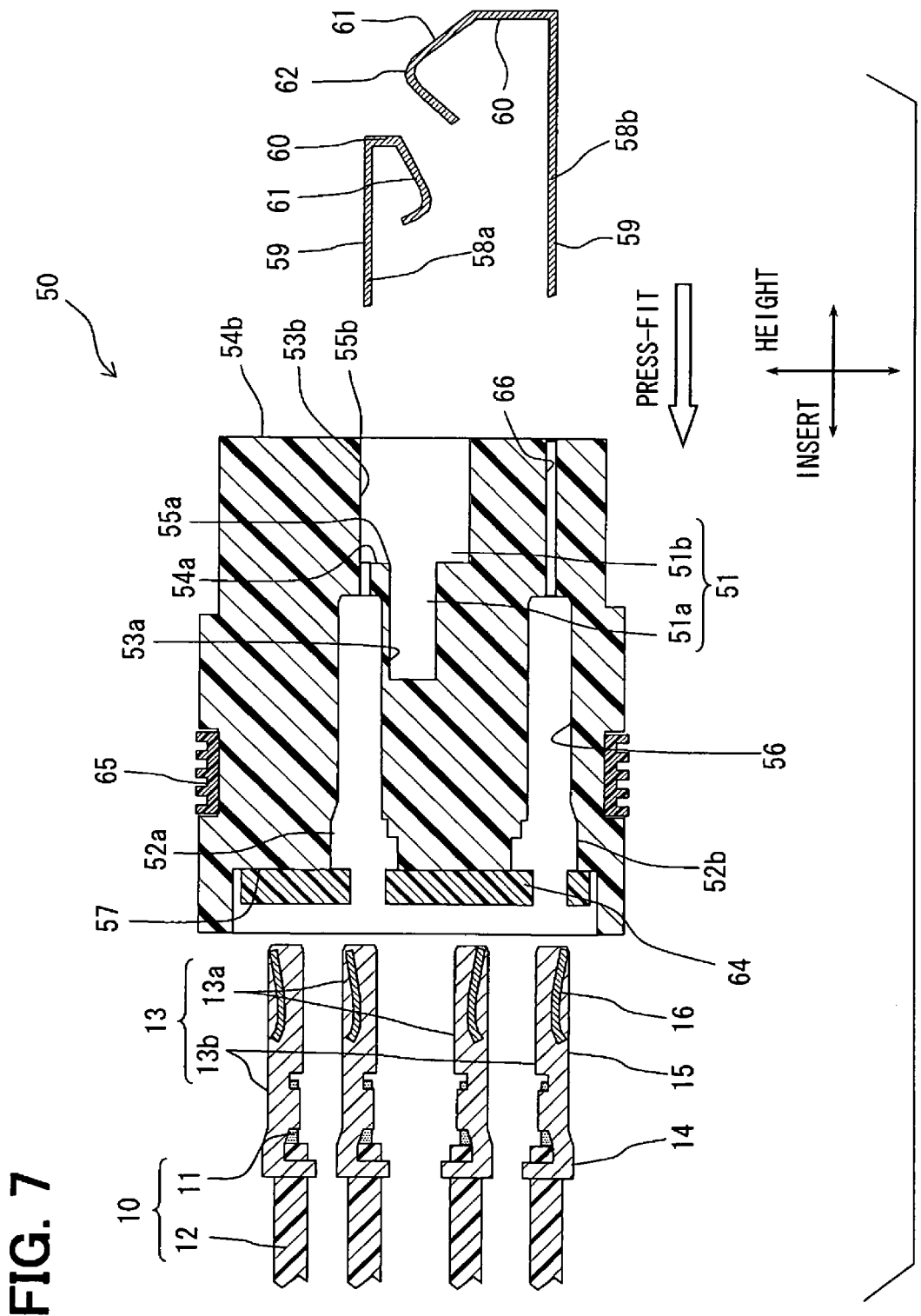

CARD EDGE CONNECTOR AND METHOD FOR ASSEMBLING THE SAME

CROSS REFERENCE TO RELATED APPLICATION

This application is based on Japanese Patent Application No. 2009-173421 filed on Jul. 24, 2009, the disclosure of which is incorporated herein by reference.

FIELD OF THE INVENTION

The present invention relates to a card edge connector and a method for assembling a card edge connector.

BACKGROUND OF THE INVENTION

Conventionally, JP-U-H06-86366 describes a card edge connector as a female connector having a connector with multi-stage connector terminals, which are arranged in a direction perpendicular to a substrate. The substrate as a male connector is a multi-layer board having multiple layers stacked in a certain order. An edge of an inner layer extends from an edge of an outermost layer to an outside of the substrate. Multiple terminals are arranged on each of the edge of the inner layer and the edge of the outer most layer. Thus, a step is formed between an inner card edge and an outer card edge in the substrate. The step is equal to a thickness of the substrate. The inner card edge is formed on the edge of the inner layer, and the outer card edge is formed on the edge of the outer most layer. With utilizing the step, the heights of the connector terminals connecting to the terminals of the inner and outer card edges are differentiated. Thus, the connector terminals provide multiple stages in the direction perpendicular to the substrate.

In the above card edge connector, since the step between the inner and outer card edges is formed with utilizing the thickness of the substrate, i.e., the thickness of the outermost layer, it is difficult to provide a sufficient height of the step. Accordingly, when the height of the step is small, it is necessary to prepare the connector terminals, which match the small height step. In this case, since a width between the connector terminals is narrow, so that the adjacent connector terminals are close. Thus, the connector terminals may contact with each other so that the terminals short-circuit.

SUMMARY OF THE INVENTION

In view of the above-described problem, it is an object of the present disclosure to provide a card edge connector and a method for assembling a card edge connector. Robustness of the card edge connector with respect to arrangement tolerance and robustness with respect to electric connection are improved.

According to a first aspect of the present disclosure, a card edge connector for electrically coupling between one of a plurality of contact electrodes of an electric circuit board and a corresponding harness connecting to an external circuit, the connector includes: a housing including a board insertion opening, into which one end of the electric circuit board is inserted along with an insertion direction; a plurality of harness terminals disposed in the housing, wherein each harness terminal is coupled with a corresponding harness; and a plurality of junction terminals disposed in the housing, wherein each junction terminal includes a first end contacting a corresponding contact electrode and a second end contacting a corresponding harness terminal. The plurality of contact electrodes disposed on the electric circuit board and includes a plurality of first contact electrodes and a plurality of second contact electrodes. A distance between each first contact electrode and the one end of the electric circuit board is smaller than a distance between each second contact electrode and the one end of the electric circuit board. A predetermined number of the plurality of first contact electrodes is disposed on a first surface of the electric circuit board, and a remaining number of the plurality of first contact electrodes is disposed on a second surface of the electric circuit board. A predetermined number of the plurality of second contact electrodes is disposed on the first surface of the electric circuit board, and a remaining number of the plurality of second contact electrodes is disposed on the second surface of the electric circuit board. The predetermined number of the plurality of first contact electrodes and the predetermined number of the plurality of second contact electrodes are aligned on the first surface alternately along with a width direction of the electric circuit board perpendicular to the insertion direction so that one of the plurality of first contact electrodes on the first surface and one of the plurality of second contact electrodes on the first surface are displaced in the width direction. The remaining number of the plurality of first contact electrodes and the remaining number of the plurality of second contact electrodes are aligned on the second surface alternately along with the width direction of the electric circuit board perpendicular to the insertion direction so that one of the plurality of first contact electrodes on the second surface and one of the plurality of second contact electrodes on the second surface are displaced in the width direction. One of the plurality of first contact electrodes on the first surface and one of the plurality of second contact electrodes on the second surface are aligned along with the insertion direction to sandwich the electric circuit board, and another one of the plurality of first contact electrodes on the second surface and another one of the plurality of second contact electrodes on the first surface are aligned along with the insertion direction to sandwich the electric circuit board. The first end of one of the plurality of junction terminals contacting a corresponding contact electrode on the first surface extends from a first inner wall of the board insertion opening to reach a centerline of the electric circuit board. The first inner wall faces the first surface. The second end of another one of the plurality of junction terminals contacting a corresponding contact electrode on the second surface extends from a second inner wall of the board insertion opening to reach the centerline of the electric circuit board. The second inner wall faces the second surface.

In the above card edge connector, the first end of the junction terminal contacting the contact electrode on one surface of the board and the first end of the junction terminal contacting the contact electrode on the other surface of the board are space apart from each other by a certain distance in the insertion direction. Thus, the first end of the junction terminal contacting the contact electrode on one surface of the board and the first end of the junction terminal contacting the contact electrode on the other surface of the board are restricted from contacting with each other. Further, the elastic deformation distance of the junction terminal is equal to or larger than a half of the thickness of the board. The contact pressure between the junction terminal and the board is sufficient. Thus, robustness of the card edge connector with respect to arrangement tolerance and robustness with respect to electric connection are improved. The electric coupling between the junction terminal and the contact electrode is improved.

According to a second aspect of the present disclosure, a method for assembling the card edge connector according to the first aspect of the present disclosure is provided. Each junction terminal includes a harness terminal contact portion, a connection portion and an electrode contact portion. The harness terminal contact portion is disposed in the housing and extends from a housing surface of the housing to the harness terminal. The connection portion is connected to one end of the harness terminal contact portion, which is disposed on the housing surface. The connection portion extends from the one end of the harness terminal contact portion to one end of the connection portion along with the housing surface. The one end of the connection portion is disposed in the board insertion opening. The electrode contact portion is coupled with the one end of the connection portion. The electrode contact portion protrudes from the housing surface in the board insertion opening. The housing is made of resin, and formed by an injection molding method. The housing further includes a fine hole and a terminal insertion opening. The harness terminal is inserted into the terminal insertion opening. The fine hole extends from the housing surface to the terminal insertion opening. The method includes: press-inserting the harness terminal contact portion into the fine hole in such a manner that a part of the harness terminal contact portion is. disposed in the terminal insertion opening; inserting the harness terminal into the terminal insertion opening; and inserting the electric circuit board into the board insertion opening.

In the above method, the first end of the junction terminal contacting the contact electrode on one surface of the board and the first end of the junction terminal contacting the contact electrode on the other surface of the board are restricted from contacting with each other. Further, the contact pressure between the junction terminal and the board is sufficient. Thus, robustness of the card edge connector with respect to arrangement tolerance and robustness with respect to electric connection are improved. The electric coupling between the junction terminal and the contact electrode is improved.

According to a third aspect of the present disclosure, a method for assembling the card edge connector according to the first aspect of the present disclosure is provided. The method includes: forming the housing from resin by an injection molding method so that the junction terminal is insert-molded in the housing; inserting the harness terminal into the terminal insertion opening; and inserting the electric circuit board into the board insertion opening.

In the above method, the first end of the junction terminal contacting the contact electrode on one surface of the board and the first end of the junction terminal contacting the contact electrode on the other surface of the board are restricted from contacting with each other. Further, the contact pressure between the junction terminal and the board is sufficient. Thus, robustness of the card edge connector with respect to arrangement tolerance and robustness with respect to electric connection are improved. The electric coupling between the junction terminal and the contact electrode is improved.

BRIEF DESCRIPTION OF THE DRAWINGS

The above and other objects, features and advantages of the present invention will become more apparent from the following detailed description made with reference to the accompanying drawings. In the drawings:

FIG. 7 is a diagram showing an exploded cross sectional view for explaining the method for assembling the card edge connector;

DETAILED DESCRIPTION OF THE PREFERRED EMBODIMENTS

Figure 1:
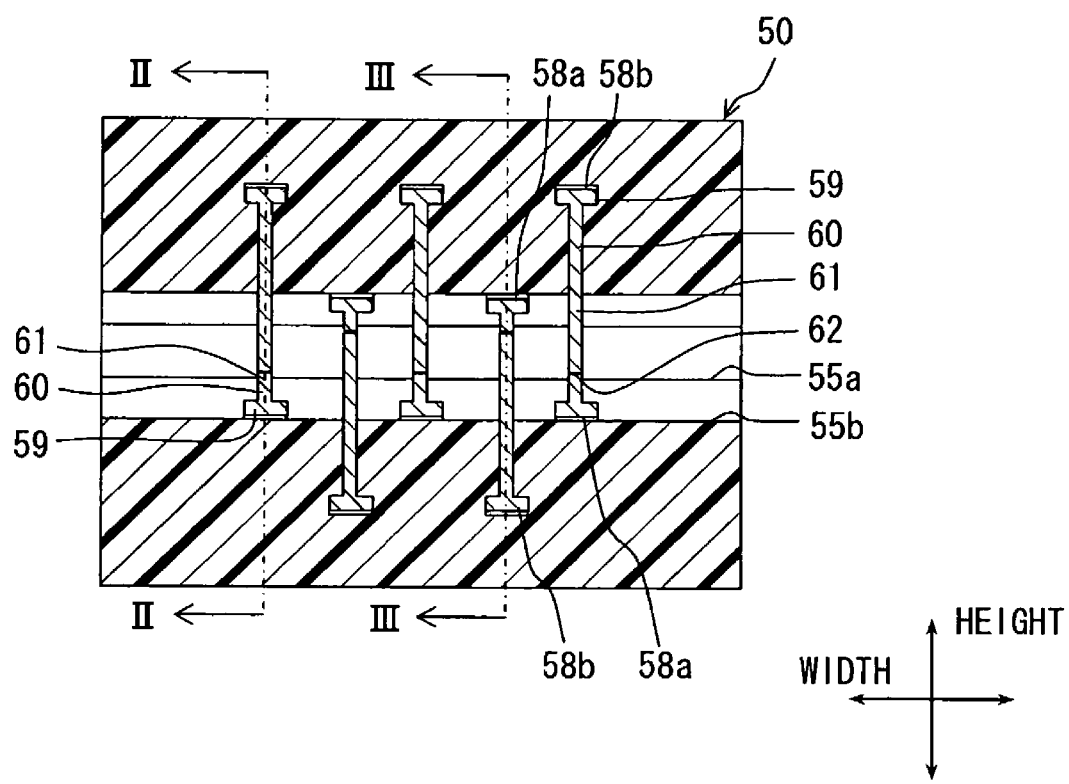
FIG. 1 is a diagram showing a cross sectional view of a junction terminal in a housing of a card edge connector according to a first embodiment.

One of the present inventor has studied about a card edge connector and a method for assembling a card edge connector. The edge connector as a female connector has connector terminals, which are arranged in a multiple stage manner along with a direction perpendicular to the surface of an electric circuit board. A distance between adjacent connector terminals is sufficiently secured. This card edge connector is disclosed in JP-A-2008-015471. The card edge connector includes a housing having an insert opening, into which one end of the electric circuit board is inserted, a first contact conductor, a second contact conductor, an auxiliary contact conductor and a connection element. The first contact conductor contacts a top contact edge of the electric circuit board, which is disposed on a top of the board in an insertion direction. The second contact conductor contacts a middle contact edge of the electric circuit board, which is disposed on a middle of the board in the insertion direction. Here, the middle contact edge is disposed inside of the board from the top contact edge. The auxiliary contact conductor is arranged in the housing. The auxiliary contact conductor is separated from the surface of the electric circuit board further than the first contact conductor in the direction perpendicular to a plane of the contact edge of the electric circuit board. The connection element connects between the auxiliary contact conductor and the second contact conductor.

Thus, even when the top contact edge and the middle contact edge are formed along with the insertion direction, the card edge connector provides multiple stage connector having the first contact conductor and the auxiliary contact conductor as the connector terminal, which are sufficiently spaced apart from each other since the auxiliary contact conductor is arranged apart from the electric circuit board farther than the first contact conductor.

In the card edge connector disclosed in JP-A-2008-015471, which was filed by the one of the present inventors previously, the top contact edge formed on a front surface of the board is opposite to the top contact edge formed on a backside surface of the board in the direction perpendicular to the plane, on which the contact edges of the board are formed. Further, the middle contact edge formed on the front surface of the board is opposite to the middle contact edge formed on the backside surface of the board. In this case, before the electric circuit board is inserted into the insert opening of the housing, the contact conductor as a front contact conductor is to be contact with the contact edge formed on the front surface of the board, and the contact conductor as a backside contact conductor is to be contact with the contact edge formed on the backside surface of the board. A part of the front contact conductor is opposite to a part of the backside contact conductor. Accordingly, it is necessary to keep a distance between the front contact conductor and the backside contact conductor for elastic deformation of the part of the front contact conductor and the part of the backside contact conductor in order to avoid the contact between the part of the front contact conductor and the part of the backside contact conductor. Here, even when the distance the front contact conductor and the backside contact conductor is sufficiently set, the contact pressure between the front contact conductor and the contact edge of the board and the contact pressure between the backside contact conductor and the contact edge are sufficiently secured. To keep the distance sufficiently, it is necessary to arrange the part of the front contact conductor between the front surface of the board and the center line, which is defined as a middle line between the front and the backside surfaces of the board, and further to arranged the part of the backside contact conductor between the backside surface of the board and the center line. In this case, robustness with respect to tolerance of arrangement of the contact conductor may be low. Further, the distance for the elastic deformation of the front contact conductor and the backside contact conductor is almost up to a half of the thickness of the electric circuit board, and therefore, the contact pressure may be not sufficient. Thus, robustness with respect to electric connection between the contact conductor and the contact edge may be low. When the robustness with respect to electric connection between the contact conductor and the contact edge is low, the electric connection between the contact conductor and the contact edge may be damaged.

First Embodiment

Figure 2:
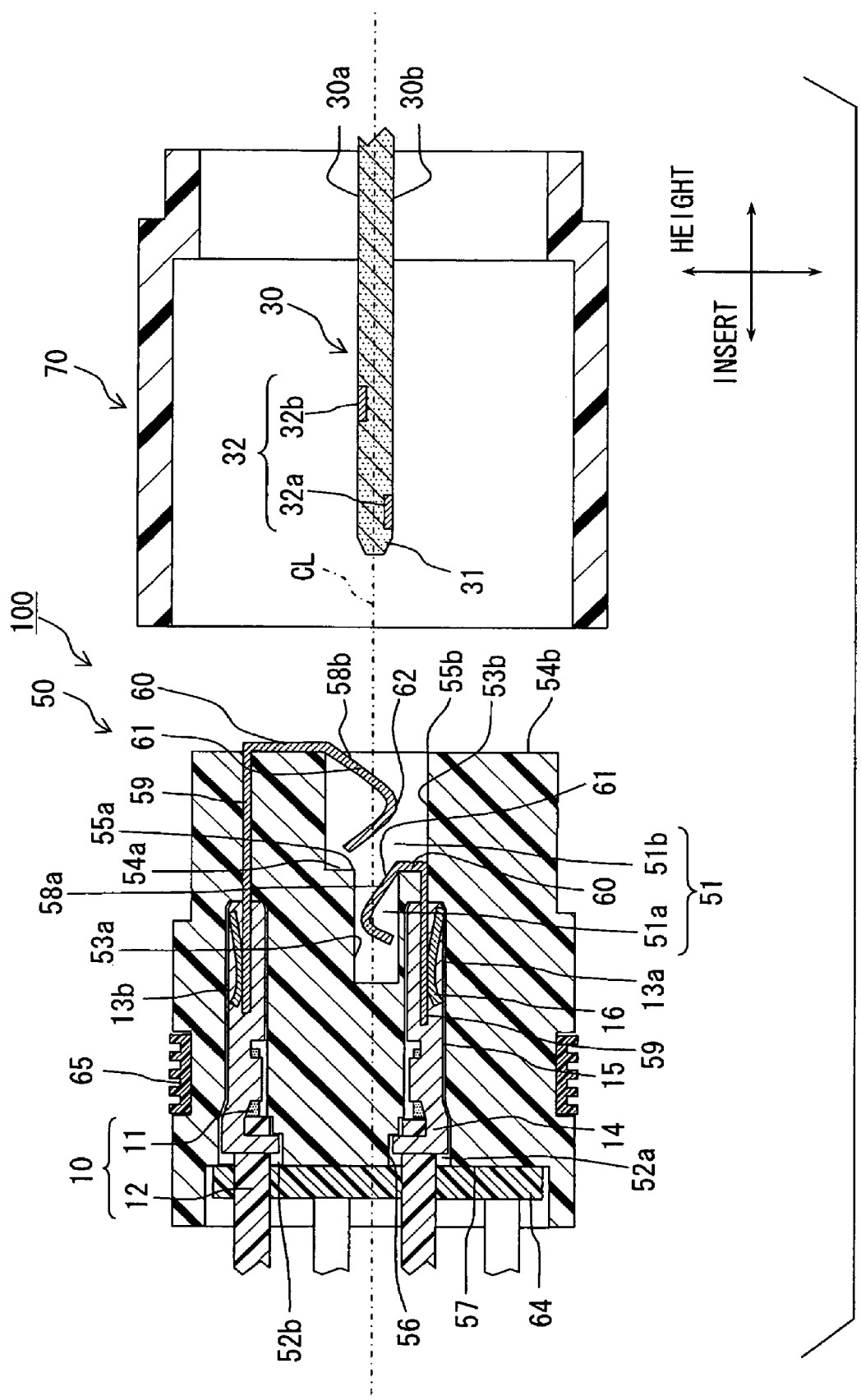
FIG. 2 is a diagram showing an exploded cross sectional view of the junction terminal along with line II-II in FIG. 1.
Figure 3:
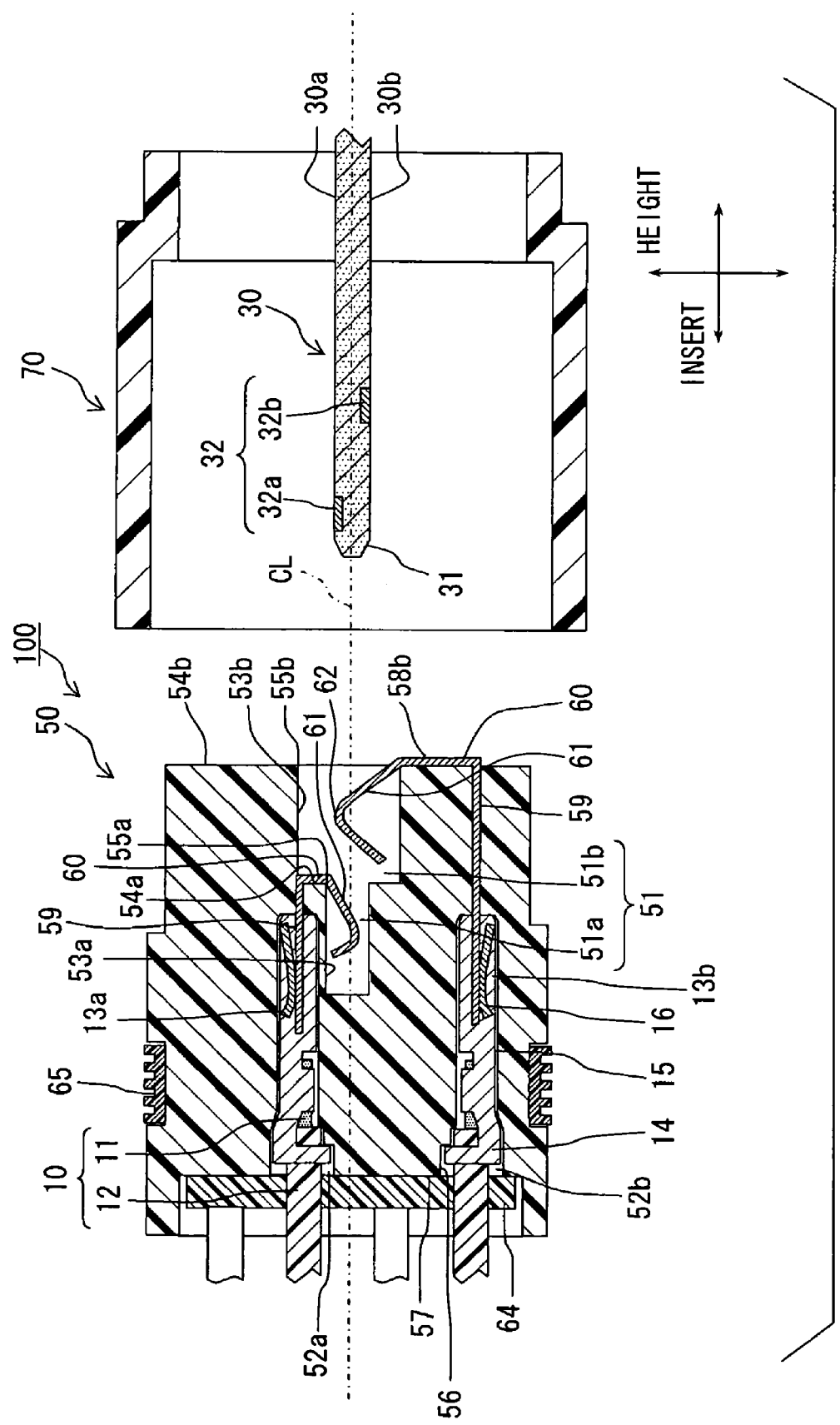
FIG. 3 is a diagram showing an exploded cross sectional view of the junction terminal along with line in FIG. 1.
Figure 4:
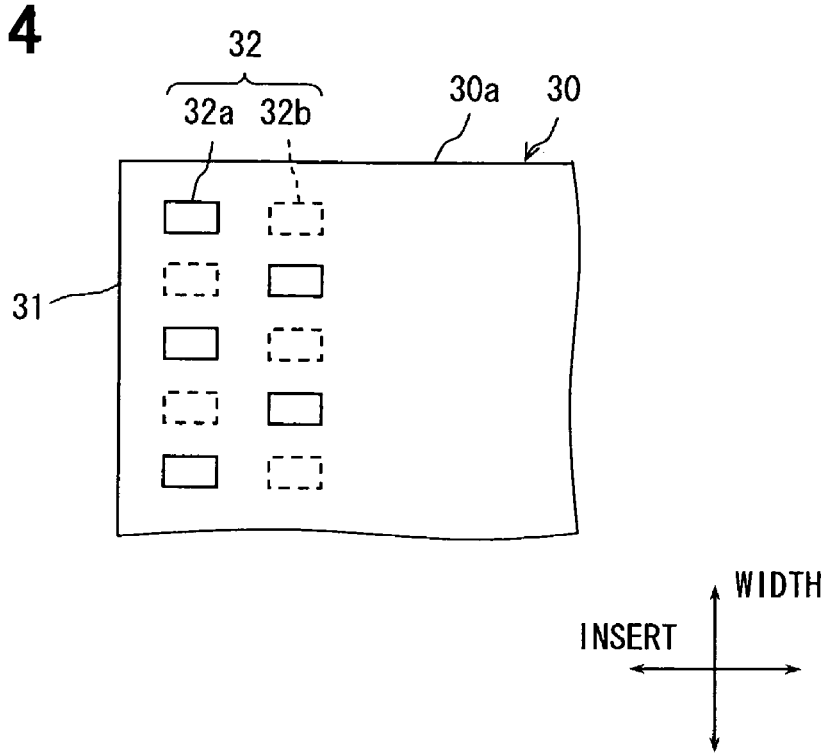
FIG. 4 is a diagram showing a plan view of arrangement of contact electrode of an electric circuit board.

FIGS. 1-8 show a card edge connector 100 according to a first embodiment. In FIG. 4, a contact electrode 32 formed on a backside 30b of an electric circuit board 30 is shown as a broken line as a matter of convenience.

An insertion direction is defined as a direction, in which the electric circuit board is inserted into an insert opening of a housing of the card edge connector. The insertion direction is in parallel to the front surface of the board and the backside surface of the board. A height direction is defined as a direction perpendicular to the front and backside surfaces of the board. A lateral direction is defined as a direction perpendicular to the insertion direction and the height direction. The lateral direction is in parallel to the front and backside surfaces of the board. Here, the lateral direction is also defined as a width direction.

The connector 100 includes a terminal 13 connecting to a part of a harness 10, and a housing 50 for supporting the harness 10 and an electric circuit board 30 so that the harness 10 is electrically coupled with the board 30. A casing 70 for accommodating the board 30 is attached to the card edge connector 100 when the casing 70 is attached to and assembled with the housing 50.

The harness 10 includes a metallic wire 11 and a coating element 12 for coating the wire 11. As shown in FIGS. 2 and 3, the terminal 13 is electrically and mechanically connected to the part of the harness 10. Thus, the terminal 13 is electrically coupled with a contact electrode 32 of the board 30 via a junction terminal 58.

The terminal 13 includes a first terminal 13a and a second terminal 13b. The first terminal 13a is arranged at a position spaced apart by a predetermined distance from the front surface 30a or the backside surface 30b of the board 30 in the height direction. The second terminal 13b is arranged at a position spaced apart from the front surface 30a or the backside surface 30b of the board 30 further than the first terminal 13a in the height direction. The first and second terminals 13a, 13b are female terminals having a connection portion 14 and a body portion 15 and a contact portion 16. The connection portion 14 is coupled with the coating element 12 of the harness 10 by a swage method. The body portion 15 has a cylindrical shape extending from the connection portion. The connection portion 16 is disposed in the body portion 15. Further, the portion 16 is elastically deformable. When a junction terminal 58 is inserted into the body portion 15, the connection portion 16 is deformed so that the junction terminal 58 contacts the connection potion with a predetermined contact pressure. Thus, the electric connection is secured. In the body portion 15, the metallic wire 11 of the harness 10 is electrically and mechanically coupled with the connection portion 16 by the swage method.

The electric circuit board 30 includes an electric element (not shown) and a wiring pattern (not shown), which is electrically coupled with the electric element. As shown in FIG. 4, the contact electrode 32 as a contact edge of the wiring pattern is formed on both of the front surface 30a and the backside surface 30b of an insertion end 31 of the board 30, which is to be inserted into the housing 50. The contact electrode 32 includes a first contact electrode 32a and a second contact electrode 32b. The first contact electrode 32a is disposed on the head portion of the board 30, which is the top end of the board 30 near the insertion end 31. The second contact electrode 32b is separated from the first contact electrode by a predetermined distance from the insertion end 31 of the board 30. The contact electrode 32 is formed on each of the front and backside surfaces 30a, 30b of the board 30. The contact electrode 32 has a rectangular shape with a long side and a short side. The long side of the contact electrode 32 is in parallel to the insertion direction of the board 30. In this case, a contact area between the contact electrode 32 and the junction terminal 58 along with the insertion direction is larger than a case where the contact electrode 32 has a square shape.

The first and second contact electrodes 32a, 32b are arranged in a zigzag manner so that the adjacent first and second contact electrodes 32a, 32b are shifted from each other in the lateral direction. Thus, the adjacent first and second contact electrodes 32a, 32b are not aligned along with the insertion direction. Thus, the first and second contact electrodes 32a, 32b are alternately arranged along with the lateral direction. In this case, a distance between the adjacent first contact electrodes 32a along with the lateral direction is determined such that a part of the junction terminal 58 (as a second junction terminal 58b) to contact with the second contact electrode 32b does not contact with the first contact electrode 32a when the board 30 is inserted into an insertion opening 51 of the housing 50. Thus, the first and second contact electrodes 32a, 32b are alternately arranged on the front and backside surfaces 30a, 30b of the board 30 so that the first and second contact electrodes 32a, 32b provide a zigzag pattern. The zigzag pattern of the contact electrode 32 formed on the front surface 30a is line-symmetric with the zigzag pattern of the contact electrode 32 formed on the backside surface 30b. Thus, the first contact electrode 32a formed on the front surface 30a and the second contact electrode 32b formed on the backside surface 30b are arranged along with the insertion direction so that the first and second contact electrodes 32a, 32b are aligned along with the insertion direction, respectively. The second contact electrode. 32b formed on the front surface 30a and the first contact electrode 32a for formed o the backside surface 30b are arranged along with the insertion direction so that the first and second contact electrodes 32a, 32b are aligned along with the insertion direction, respectively.

The housing 50 supports the harness 10 and the board 30. The housing 50 couples the contact electrode 32 and the terminal 13 via the junction terminal 58. The housing 50 is formed by an injection molding method of resin. The housing 50 includes the board insertion opening 51 such that the board 30 is inserted into the board insertion opening 51. The housing 50 further includes a terminal insertion opening 52 such that the terminal 13 of the harness 10 is inserted into the terminal insertion opening 52. The junction terminal 58 for coupling electrically between the terminal 13 and the contact electrode 32 is formed in the housing 50 such that one end of the junction terminal 58 protrudes into the board insertion opening 51, and the other end of the junction terminal 58 protrudes into the terminal insertion opening 52.

The board insertion opening 51 includes a first board insertion opening 51a and a second board insertion opening 51b, as shown in FIGS. 2 and 3. The first board insertion opening 51a corresponds to a part of the board 30, on which the first contact electrode 32a is formed. The second board insertion opening 51b corresponds to a part of the board 30, on which the second contact electrode 32b is formed. The first board insertion opening 51a is surrounded with the first inner wall 53a having an upper surface and a lower surface. The second board insertion opening 51b is surrounded with the second inner wall 53b having an upper surface and a lower surface. The first inner wall 53a and the second inner wall 53b are substantially perpendicular to the insertion direction of the board 30. The first and second inner walls 53a, 53b are defined as a housing surface for providing the first board insertion opening 51a. The first board insertion opening 51a is connected to the first housing surface 54a. Thus, a corner 55a is formed between the inner wall 53a and the first housing surface 54a. The corner 55a contacts a connection portion between an electrode contact portion 61 and a connection portion 60 in the first junction terminal 58a. Similarly, the second housing surface 54b provides the second board insertion opening 51b. A corner 55b is formed between the second inner wall 53b and the second housing surface 54b. The corner 55b contacts a connection portion between the electrode contact portion 61 and the connection portion 60 in the second junction terminal 58b. The inner walls 53a, 53b correspond to a wall surface of the board insertion opening. A facing distance between the front surface 30a of the board 30 and the first inner wall 53a is equal to a facing distance between the backside surface 30b and the first inner wall 53a. A facing distance between the front surface 30a and the second inner wall 53b is equal to a facing distance between the backside surface 30b and the second inner wall 53b. The second inner wall 53b is substantially perpendicular to the first housing surface 54a so that a 90-degree corner is formed.

The terminal insertion opening 52 includes a first terminal insertion opening 52a and a second terminal insertion opening 52b, as shown in FIGS. 2 and 3. The first terminal insertion opening 52a is spaced apart from the front or backside surface 30a, 30b of the board 30 by a predetermined distance in the height-direction so that the first terminal insertion opening 52a provides a space for accommodating the first junction terminal 58a. The second terminal insertion opening 52b is spaced apart from the front or backside surface 30a, 30b of the board 30 further than the first terminal insertion opening 52a. The first terminal 13a of the terminal 13 is inserted into the first terminal insertion opening 52a. The second terminal 13b of the terminal is inserted into the first terminal insertion opening 52b. A protrusion (not shown) is formed on the third inner wall 56 for proving the terminal insertion opening 52. The protrusion is engaged with a hole (not shown), which is formed in a body 15 of the terminal 13. An assembled seal member 64 is formed on the bottom 57 of the housing 50. The assembled seal member 64 includes multiple sealing members, which are integrated so that each sealing member seals a clearance between the harness 10 and the housing 50. The harness 10 is retrieved from the housing 50 via the clearance.

The junction terminal 58 is formed from one metallic plate such that the metallic plate is punched, and then, bent. The junction terminal 58 includes a first junction terminal 58a and a second junction terminal 58b. The first junction terminal 58a electrically connects between the first contact electrode 32a and the first terminal 13a, which are formed on the front surface 30a and the backside surface 30b, respectively. The second junction terminal 58b electrically connects between the second contact electrode 32b and the second terminal 13b, which are formed on the front surface 30a and the backside surface 30b, respectively.

As shown in FIG. 1, the first junction terminal 58a and the second junction terminal 58b are arranged in the height direction so that the first and second junction terminals 58a, 58b provide a pair. The pair of the first and second junction terminals 58a, 58b is arranged along with the lateral direction such that the first junction terminal 58a is spaced apart from the second junction terminal 58b by a predetermined distance. Specifically, as shown in FIG. 2, the first junction terminal 58a connecting to the first contact electrode 32a formed on the front surface 30a, and the second junction terminal 58b connecting to the second contact electrode 32b formed on the backside surface 30b provide a pair such that the first and second junction terminals 58a, 58b are aligned in the height direction. As shown in FIG. 3, the second junction terminal 58b connecting to the second contact electrode 32b formed on the front surface 30a, the first junction terminal 58a connecting to the first contact electrode 32a formed on the backside surface 30b provide a pair such that the first and second junction terminals 58a, 58b are aligned in the height direction. The first terminal 13a and the second terminal 13b are alternately aligned in the lateral direction such that the arrangement of the first and second terminals 13a, 13b corresponds to arrangement of the junction terminal 58, and the first and second terminals 13a, 13b have different heights in the housing 50.

The first junction terminal 58a includes a terminal contact portion 59, a connection portion 60, and an electrode contact portion 61. The terminal contact portion 59 extends from the first housing surface 54a to the first terminal 13a via the first terminal insertion opening 52a in the housing 50. The connection portion 60 extends from a connection part between the terminal contact portion 59 and the connection portion 60 to the corner 55a along with the first housing surface 54a so that the connection portion 60 is coupled with one end of the terminal contact portion 59 on the first housing surface side. The electrode contact portion 61 protrudes into the first insertion opening 51a such that the electrode contact portion 61 is coupled with one end of the connection portion 60 on the corner side. The second junction terminal 58b includes a terminal contact portion 59, a connection portion 60, and an electrode contact portion 61. The terminal contact portion 59 extends from the second housing surface 54b to the second terminal 13b via the second terminal insertion opening 52b in the housing 50. The connection portion 60 extends from a connection part between the terminal contact portion 59 and the connection portion 60 to the corner 55b along with the second housing surface 54b so that the connection portion 60 is coupled with one end of the terminal contact portion 59 on the second housing surface side. The electrode contact portion 61 protrudes into the second insertion opening 51b such that the electrode contact portion 61 is coupled with one end of the connection portion 60 on the corner side. The electrode contact portion 61 corresponds to one end part of the junction terminal. The terminal contact portion 59 corresponds to the other end part of the junction terminal.

As shown in FIGS. 2 and 3, a connection angle between the terminal contact portion 59 and the connection portion 60 is substantially 90 degrees. Thus, the terminal contact portion 59 and the connection portion 60 are connected to each other in a L-shaped manner. One end of the terminal contact portion 59 on the terminal insertion opening side is inserted into the body 15 of the terminal 13 so that the terminal contact portion 59 contacts and electrically couples with the contact point 16.

A connection angle between the electrode contact portion 61 and the connection portion 60 is an obtuse angle. Thus, the electrode contact portion 61 and the connection portion 60 are coupled with each other in a dog-leg shaped manner. One end of the electrode contact portion 61 protruding into the insertion openings 51a, 51b contacts and electrically couples with the contact electrodes 32a, 32b, respectively.

The electrode contact portion 61 is deformed by pressure caused by insertion of the board 30 when the board 30 is inserted into the board insertion opening 51. Specifically, the electrode contact portion 61 is deformed such that the connection angle between the connection portion 60 and the electrode contact portion 61 changes from the obtuse angle to a substantially right angle. Further, the electrode contact portion 61 itself is elastically deformed. Thus, the contact pressure with respect to the contact electrode 32 is generated so as to press-contact the contact electrode 32. As shown in FIGS. 2 and 3, the one end of the electrode contact portion 61 protruding into the insertion openings 51a, 51b is bent so as to have a convexity shape with respect to a center line CL of the housing 50. A top 62 of the bent one end contacts the contact electrode 32 of the board 30.

As shown in FIGS. 1-3, the electrode contact portion 61 in the first junction terminal 58a connecting to the first contact electrode 32a formed on the front surface 30a, and the electrode contact portion 61 in the second junction terminal 58b connecting to the second contact electrode 32b formed on the front surface 30a cross the center line CL and extend to the backside of the electric circuit board 30. The electrode contact portion 61 in the first junction terminal 58a connecting to the first contact electrode 32a formed on the backside surface 30b, and the electrode contact portion 61 in the second junction terminal 58b connecting to the second contact electrode 32b formed on the backside surface 30b cross the center line CL and extend to the front side of the electric circuit board 30. Thus, the top 62 of the electrode contact portion 61 crosses the center line CL, and extends to the backside of the board 30 is arranged on a lower side from the center line CL. The top 62 of the electrode contact portion 61 crosses the center line CL, and extends to the front side of the board 30 is arranged on an upper side from the center line CL.

Figure 5A:
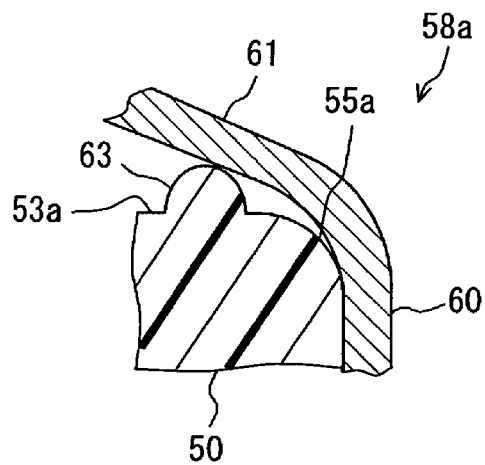
FIG. 5A is a diagram showing an enlarged cross sectional view of a protrusion for supporting a first junction terminal.
Figure 5B:
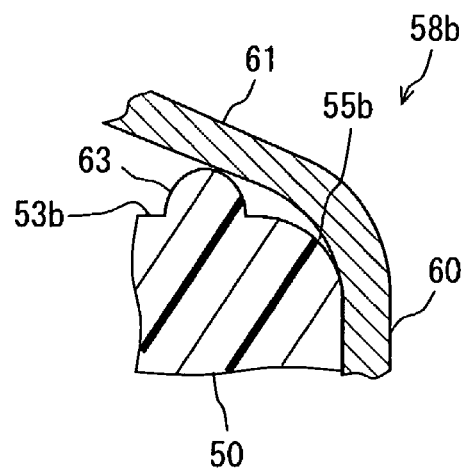
FIG. 5B is a diagram showing an enlarged cross sectional view of a protrusion for supporting a second junction terminal.

As shown in FIG. 5A, a connection part between the electrode contact portion 61 and the connection portion 60 in the first junction terminal 58a contacts the corner 55a. As shown in FIG. 5B, a connection part between the electrode contact portion 61 and the connection portion 60 in the second junction terminal 58b contacts the corner 55b. A convexity 63 is formed on each inner wall 53a, 53b. The convexity 63 supports the electrode contact portion 61 so as to maintain the connection angle between the electrode contact portion 61 and the connection portion 60 to be constant when the board 30 is inserted into the substrate insertion opening 51. When the board 30 is inserted into the substrate insertion opening 51, the pressure caused by insertion of the board 30 is applied to the electrode contact portion 61, and then, the electrode contact portion 61 is bent in the insertion direction such that a contact part of the electrode contact portion 61 contacting the board 30 functions as a point of effort, and a contact part (i.e., a linear part) of the electrode contact portion 61 contacting the convexity 63 functions as a pivot point. Thus, the electrode contact portion 61 is bent in the insertion direction at a contact position between the linear portion of the electrode contact portion 61 and the convexity 63 as a pivot point. The electrode contact portion 61 is not bent at a contact position between the corner 55 and the connection portion, which is disposed between the electrode contact portion 61 and the connection portion 60. The electrode contact portion 61 has a curved shape.

When the electrode contact portion 61 is bent, and the contact position between the corner 55 and the connection portion of the electrode contact portion 61 and the connection portion 60 functions as a pivot point. Since the corner 55 has a R shape, i.e., the corner 55 is rounded in the microscopical sense, as shown in FIGS. 5A and 5B, the contact position between the corner 55 and the connection portion between the electrode contact portion 61 and the connection portion 60 may be varied. As a result, change of the connection angle between the electrode contact portion 61 and the connection portion 60 may be not stable, so that the contact pressure with respect to the contact electrode 32 is varied. However, in the present embodiment, since the convexity 63 is formed on the inner walls 53a, 53b, the pivot point of the electrode contact portion 61 is stable when the electrode contact portion 61 is bent. Accordingly, the change of the connection angle between the electrode contact portion 61 and the connection portion 60 is constant, and the variation of the contact pressure with respect to the contact electrode 32 is reduced.

When the casing 70 is engaged with the housing 50, space for accommodating the board 30 is sealed. Thus, the board 30 is accommodated in the inner space provided by the casing 70 and the housing 50. A groove (not shown) for guiding insertion of the board 30 into the casing 70 is formed on a inner sidewall of the casing 70. A support member (not shown) for supporting the board 30 is formed on the inner bottom of the casing 70 together with the groove. When the casing 70 is engaged with and connected to the housing 50. The housing 50 is inserted into the casing 70. Thus, the casing 70 and the housing 50 are assembled.

Figure 6:
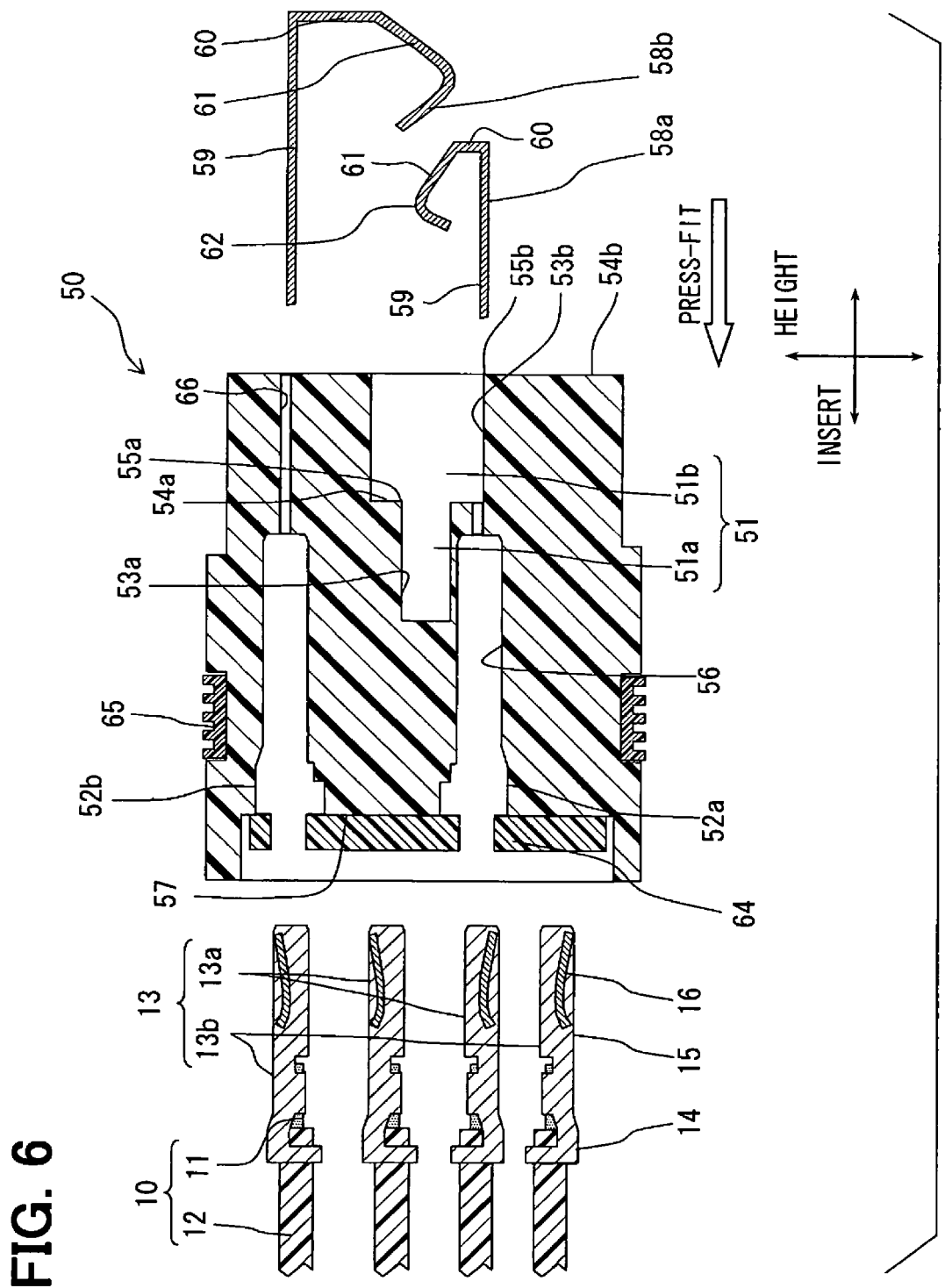
FIG. 6 is a diagram showing an exploded cross sectional view for explaining a method for assembling the card edge connector.

Next, waterproof of the card edge connector 100 will be explained. When the card edge connector 100 is mounted on the vehicle, it is necessary to protect the card edge connector 100 from water. Specifically, it is necessary to prevent the water from penetrating into the connector 100. In the present embodiment, the assembled seal member 64 is formed on the bottom 57 of the housing 50. The assembled seal member 64 seals a clearance of a portion, through which the harness 10 is retrieved from the housing 50. As shown in FIGS. 6 and 7, multiple through holes for coupling the terminal insertion opening 52 and the outside of the housing 50 are formed in the assembled seal member 64. When the terminal 13 is inserted into the terminal insertion opening 52, the terminal 13 is inserted into the terminal insertion opening 52 via the through hole of the assembled seal member 64. Thus, the assembled seal member 64 is arranged around the harness 10. Thus, the clearance of the portion, through which the harness 10 is retrieved from the housing 50, is sealed, so that the water is prevented from being penetrated into the terminal insertion opening 52. Further, the seal member 65 is formed on an engagement surface of the housing 50, on which the casing 70 is engaged. The seal member 65 is disposed on all of circumference of the engagement surface. Thus, water is prevented from being penetrated into inner space provided by the housing 50 and the casing 70.

Next, a manufacturing method of the card edge connector 100 will be explained with reference to FIGS. 6 and 7. Firstly, the harness 10, the housing 50, the junction terminal 58, and the casing 70 are prepared. Here, the board 30 is preliminary inserted into the casing 70. Then, the terminal contact portion 59 is press-inserted into a fine hole 66 so that the junction terminal 58 is attached to the housing 50. The fine hole 66 is formed to reach from the housing surface 54 to the terminal insertion opening 52. Thus, a press insertion process is completed. Here, the fine hole 66 is formed at the 90-degree corner provided by the second inner wall 53b and the first housing surface 54a. When the first junction terminal 58a is press-inserted into the fine hole 66, the first junction terminal 58a and the second junction terminal 58b are arranged to align in the insertion direction without contacting the first junction terminal 58a and the second junction terminal 58b.

Figure 8A:
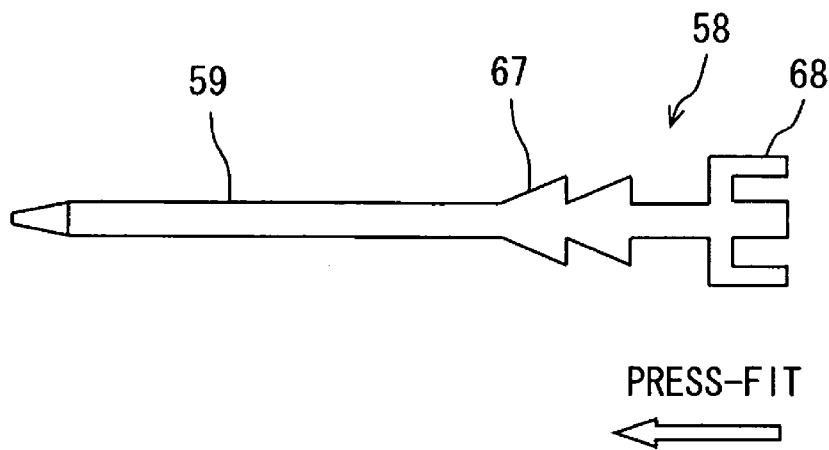
FIG. 8A is a diagram showing a plan view of the junction terminal.
Figure 8B:
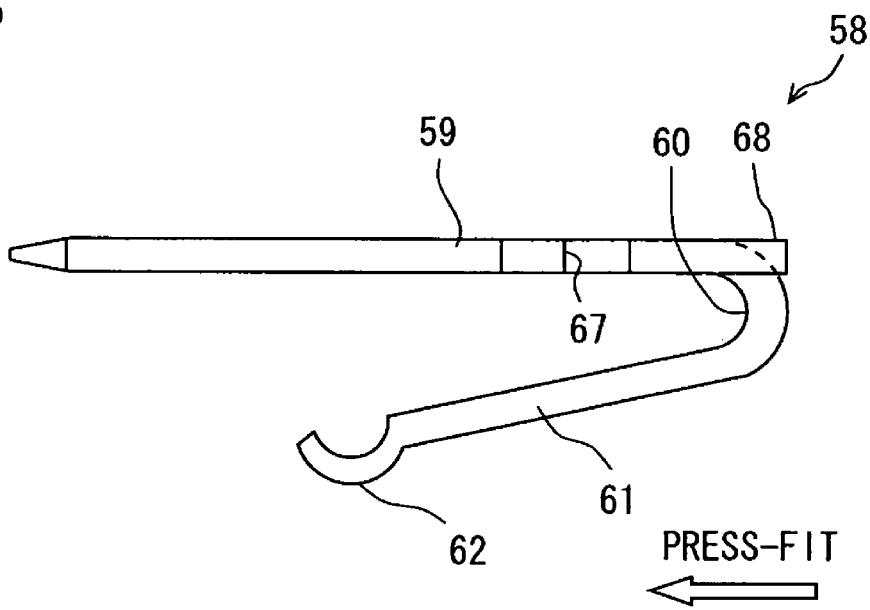
FIG. 8B is a diagram showing a side view of the junction terminal.

As shown in FIG. 8, the shape of one end of the terminal contact portion 59 on the terminal insertion opening side is tapered. Thus, resistance in a case where the terminal contact portion 59 is press-inserted into the fine hole 66 is reduced. Further, a barb 67 having a tapered shape is formed in a part of the terminal contact portion 59, which is inserted into the fine hole 66. The width of the barb 67 gradually increases. A tab 68 is formed on one end of the terminal contact portion 59 on the housing surface side. The force for press-inserting the terminal contact portion 59 is applied via the tab 68. In the above press-insertion process, the force, the pressure along with the insertion direction is applied to the tab 68, so that the terminal contact portion 59 is press-inserted into the fine hole 66. The insertion direction is in parallel to an arrow shown in FIGS. 6-8. A protrusion (not shown) is formed on an inner wall for providing the fine hole 66. The protrusion is engaged with the barb 67. When the terminal contact portion 59 is completely inserted into the fine hole 66, the barb 67 and the protrusion are engaged. Thus, the mechanical connection between the terminal contact portion 59 and the housing 50 is strengthened. Thus, an attachment position between the terminal contact portion 59 and the housing 50 is not changed, so that electric connection between the terminal contact portion 59 and the contact portion 16 and electric connection between the electrode contact portion 61 and the contact electrode 32 are improved. Here, when the press-insertion process ends, the top end of the terminal contact portion 59 in the junction terminal 58 protrudes into the terminal insertion opening 52.

After the press-insertion process, the tab 68 is removed. Thus, a removing process is completed.

After the removing process, the terminal 13 connected to the harness 10 is inserted into the terminal insertion opening 52. Specifically, the terminal 13 is inserted into the terminal insertion opening 52 such that the terminal 13 penetrates the assembled seal member 64. Thus, the first insertion process is completed. In the first insertion process, the terminal 13 completely penetrates the through hole of the assembled seal member 64 so that the assembled seal member 64 is disposed around the harness 10. Thus, the terminal 13 connected to the harness 10 is inserted into the terminal insertion opening 52. Then, the clearance between the harness 10 and the housing 50 is sealed. The harness 10 is retrieved from the housing 50 via the clearance. Further, when the terminal 13 is completely inserted into the terminal insertion opening 52, the top surface of the body 15 of the terminal 13 is sealed. Accordingly, the top end of the terminal contact portion 59 of the junction terminal 58, which is attached to the housing 50 preliminary, is introduced into the body 15, and then, the top end of the terminal contact portion 59 contacts the contact portion 16.

After the first insertion process, the board 30 is inserted into the board insertion opening 51. Specifically, the board 30 is inserted into the board insertion opening 51 with resisting elastic force of the junction terminal 58, i.e., the electrode contact portion 61. Thus, the board 30 is sandwiched between the junction terminal 58 contacting the contact electrode 32 formed on the front surface 30a and the junction terminal 58 contacting the contact electrode 32 formed on the backside surface 30b, so that the board 30 is accommodated in the board insertion opening 51. Further, when the board 30 is inserted into the opening 51, the housing 50 is inserted into the casing 70 so that the casing 70 and the housing 50 are assembled. Thus, the seal member 65 having a ring shape is arranged between the housing 50 and the casing 70. The accommodation space for the board 30 is air-tightly sealed with the housing 50 and the casing 70. Thus, the second insertion process is completed.

Thus, the card edge connector 100 is assembled. In the above assembling method of the connector 100, the press-inserting process for press-inserting the terminal contact portion 59 into the fine hole 66 is performed. When the junction terminal 58 is formed in the housing 50 by an insert molding method, the press-insertion process and the removing process may be unnecessary. Thus, the manufacturing process for assembling the connector 100 is simplified and the number of steps in the process is reduced. However, when the junction terminal 58 is insert-molded, a cost of forming a die for insert-molding the junction terminal 58 may be high. Thus, the manufacturing cost of the connector may increase. To reduce the manufacturing cost of the connector 100, it is preferred that the housing 50 and the junction terminal 58 are prepared independently, and thus, the press-insertion process and the removing process are performed. Here, when the junction terminal 58 is formed in the housing 50 by the insert-molding method, it is preferred that the barb 67 is formed at a portion of the terminal contact portion 59, which is disposed in the housing 50 so as to increase the connection strength between the junction terminal 58 and the housing 50.

In the above assembling method, the removing process is performed just after the press-insertion process. Alternatively, the removing process may be performed after the press-insertion process and the first insertion process end. The second insertion process is performed after the first insertion process. Alternatively, the first insertion process may be performed after the, second insertion process.

The effects of the assembling method of the connector 100 will be explained. The first contact electrode 32a formed on the front surface 30a, and the second contact electrode 32b formed on the backside surface 30b are aligned in the insertion direction. Further, the second contact electrode 32b formed on the front surface 30a, and the first contact electrode 32a formed on the backside surface 30b are also aligned in the insertion direction. The first junction terminal 58a connecting to the first contact electrode 32a on the front surface 30a, and the second junction terminal 58b connecting to the second contact electrode 32b on the backside surface 30b provide a pair so as to align in the height direction. The second junction terminal 58b connecting to the second contact electrode 32b on the front surface 30a, and the first junction terminal 58a connecting to the first contact electrode 32a on the backside surface 30b provide a pair so as to align in the height direction. Thus, the top 62 of the first junction terminal 58a and the top of the second junction terminals 58b are shift in the insertion direction when, the first and second junction terminals 58a, 58b provide a pair. Thus, the top of the first junction terminal 58a does not face the top of the second junction terminals 58b. Accordingly, even if the positions of two tops 62 of the first and second junction terminals 58a, 58b are not determined exactly, the tops 62 do not contact with each other.

In the present embodiment, the electrode contact portion 61 of the first junction terminal 58a connecting to the first contact electrode 32a formed on the front surface 30a, and the electrode contact portion 61 of the second junction terminal 58b connecting to the second contact electrode 32b formed on the front surface 30a extend beyond the center line CL toward the backside. The electrode contact portion 61 of the first junction terminal 58a connecting to the first contact electrode 32a formed on the backside surface 30b, and the electrode contact portion 61 of the second junction terminal 58b connecting to the second contact electrode 32b formed on the backside surface 30b extend beyond the center line CL toward the front side. Thus, the distance for elastically deforming the electrode contact portion 61 of the junction terminal 58 is equal to or larger than a half of the thickness of the board 30. Thus, the contact pressure is sufficiently secured. Thus, the card edge connector 100 and the assembling method of the connector 100 provide to improve robustness of the card edge connector with respect to arrangement tolerance and robustness with respect to electric connection between the electrode contact portion 61 and the contact electrode 32. Thus, electric connection damage between the electrode contact portion 61 and the contact electrode 32 is restricted.

The contact electrode 32 includes the first contact electrode 32a and the second contact electrode 32b. The first contact electrode 32a is disposed at the top end of the board 30 in the insertion direction. The second contact electrode 32b is disposed apart from the insertion end 31 farther than the first contact electrode 32a. Thus, a distance between the second contact electrode 32b and the insertion end 31 is larger than the distance between the first contact electrode 32a and the insertion end 31. The terminal 13 includes the first terminal 13a and the second terminal 13b. The second terminal 13b is spaced apart from the board 30 farther than the first terminal 13a. Thus, the distance between the second terminal 13b and the board 30 is larger than the distance between the first terminal 13a and the board 30. Thus, since the second terminal 13b is spaced apart from the front surface 30a or the backside surface 30b farther than the first terminal 13a, the distance between the first and second terminals 13a, 13b is sufficient. Thus, the card edge connector 100 has multi-stage structure with sufficient distance between the first and second terminals 13a, 13b.

The terminals 13a, 13b are female terminals having the same structure. The contact electrode 32 and the terminal 13 are electrically coupled with each other via the junction terminal 58. Thus, since only one type of the female terminals having the same structure is connected to the harness, the manufacturing cost of the connector 100 is reduced, compared with a case where two types of female terminals having different structures is connected to the harness.

Specifically, the terminal is a female terminal including the contact portion 16 in the body 15. Thus, when the terminal 13 is inserted into the terminal insertion opening 52, the contact portion 16 is accommodated in the body 15, so that the terminal 13 is easily inserted into the terminal insertion opening 52, compared with a case where a male terminal and a female terminal are inserted into the housing. Here, the contact portion of the male terminal protrudes from the body.

The contact electrode 32 is formed on both of the front surface 30a and the backside surface 30b. Thus, the number of signal lines in the connector 100 increases, compared with a case where the contact electrode 32 is formed on one side of the board 30.

The contact electrode 32 has a rectangular shape having a longitudinal side, i.e., a long side, which is disposed along with the insertion direction. Accordingly, compared with a case where the contact electrode 32 has a square shape, a connection area between the contact electrode 32 and the junction terminal 58 in the insertion direction increases. Even if the board 30 shifts in the insertion direction, the electric connection between the contact electrode 32 and the junction terminal 58 is not damaged since the connection area is large.

Assuming that the first contact electrode 32a and the second contact electrode 32b are aligned in the insertion direction, and the first and second junction terminals 58a, 58b are aligned in the insertion direction, the second junction terminal 58b may temporally contact the first contact electrode 32a so that current flows through an unwanted current path in a case where the board 30 is inserted into the board insertion opening 51.

However, in the present embodiment, the first and second contact electrodes 32a, 32b are not aligned in the insertion direction, so that the first and second contact electrodes 32a, 32b shift in the lateral direction. The first and second junction terminals 58a, 58b are alternately arranged in the lateral direction with a predetermined interval soc that the first junction terminal 58a contacts the first contact electrode 32a, and the second junction terminal 528b contacts the second contact electrode 32b. Thus, when the board 30 is inserted into the board insertion opening 51, the electrode contact portion 61 of the second junction terminal 58b and the first contact electrode 32a are not temporally connected. Thus, the current does not flow through an unwanted current path. Specifically, for example, when the card edge connector 100 is mounted on the vehicle, and the casing 70 for accommodating the board 30 provides an ECU (electronic control unit), the board 30 as a functional element of the ECU is electrically connected to a battery and/or other ECUs via the harness 10. The battery and the other ECUs are mounted on the same vehicle. When the ECU is replaced to a new one, a worker for exchanging the ECU may remove the board 30 from the housing 50 under a condition that the battery is electrically connected to the harness 10. Further, when the ECU is used for the vehicle, the ECU may includes a capacitor as a charge accumulating means for continuing a process in the ECU even if the battery stops energizing the ECU temporally in case of collision or impact of an object. Accordingly, the worker may detach the board 30 from the housing 50 even when the ECU is electrically connected to the battery, or the ECU is energized from the charge accumulating means. Even in this case, in the present embodiment, the first and second contact electrodes 32a, 32b are not aligned in the insertion direction, so that the first and second contact electrodes 32a, 32b are displaced in the lateral direction. Thus, when the board 30 is inserted into the board insertion opening 51, the current does not flow through unwanted current path.

Here, if only one of multiple first terminals 13a and multiple second terminals 13b are aligned in the lateral direction, each first or second terminal 13a, 13b having the same height, it is necessary lengthen the length of the housing 50 and the board 30 in the lateral direction in order to maintain the number of the terminals 13a, 13b. Specifically, if the terminals 13a, 13b having the same height are arranged along with the lateral direction, the adjacent junction terminals 58 may contact with each other, and/or the junction terminal 58 may contact with other contact electrodes 32, which is not the corresponding contact electrode 32. Accordingly, to avoid unnecessary contact, it is necessary to arrange the terminals 13a, 13b and the contact electrodes 32 in enough space in the lateral direction.

However, in the present embodiment, the first and second terminals 13a, 13b having different heights are alternately arranged in the lateral direction. Thus, the attachment positions of the housing 50, at which the terminal contact portions 59 are attached, are different from each other in the height direction. Further, the position of the first junction terminal 58a in the insertion direction, at which the contact electrode 32 contacts, is different from the position of the second junction terminal 58b in the insertion direction, at which the contact electrode 32 contacts. The first and second junction terminals 58a, 58b are adjacent to each other in the lateral direction. Thus, even if the distance between the adjacent first and second junction terminals 58a, 58b is narrow, the junction terminals 58 do not contact with each other, and the junction terminal 58 does not contact with other contact electrodes 32, which is not the corresponding and proper contact electrode 32. Thus, the dimensions of the housing 50 in the lateral direction are reduced together with maintaining the number of the terminals 58a, 58b.

When the board 30 is inserted into the board insertion opening 51, the electrode contact portion 61 of the second junction terminal 58b disposed on the opening side of the board insertion opening 51 is displaced and deformed toward the inserting direction of the board 30. Here, the inserting direction is a left side direction in FIGS. 2 and 3. Accordingly, for example, when the first junction terminal 58a is arranged in the displacement direction of the electrode contact portion 61 of the second junction terminal 58b, the first junction terminal 58a may contact with the second junction terminal 58b since the second junction terminal 58b is displaced. However, in the present embodiment, as shown in FIGS. 2 and 3, since the electrode contact portion 61 of the first junction terminal 58a is not arranged in the displacement direction of the electrode contact portion 61 of the second junction terminal 58b, the first junction terminal 58a does not contact with the second junction terminal 58b. Specifically, since the displacement of the electrode contact portion 61 of the junction terminal 58b is restricted by the first housing surface 54a, the electrode contact portion 61 of the first junction terminal 58a, which is arranged on the inner side of the board insertion opening 51, does not contact with the electrode contact portion 61 of the second junction terminal 58b.

Figure 9:
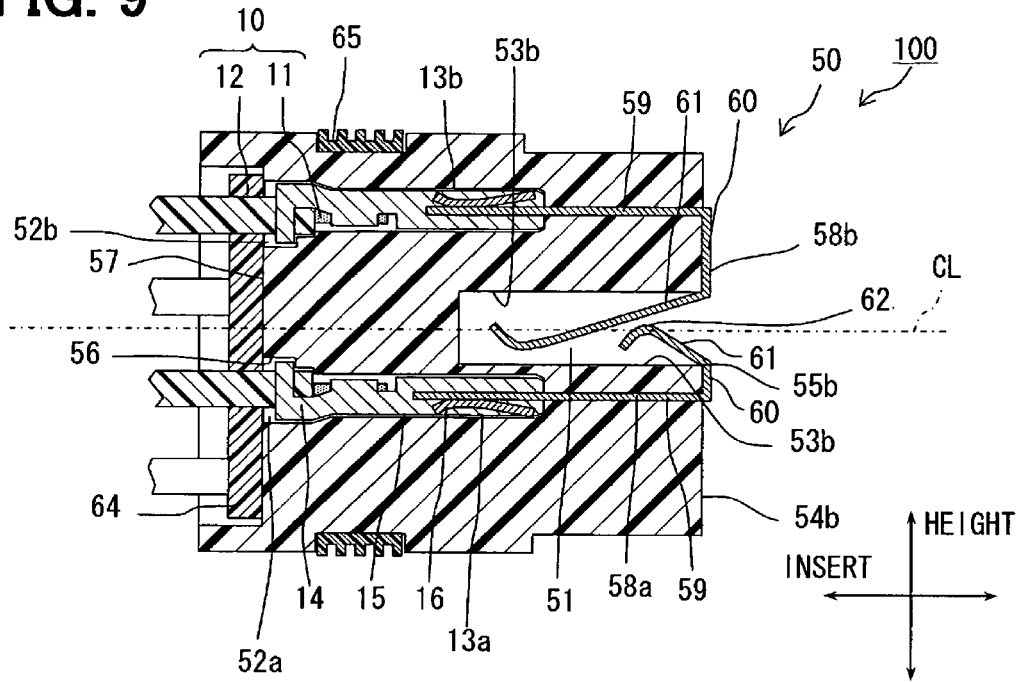
FIG. 9 is a diagram showing a cross sectional view of a card edge connector according to a modification of the first embodiment.
Figure 10:
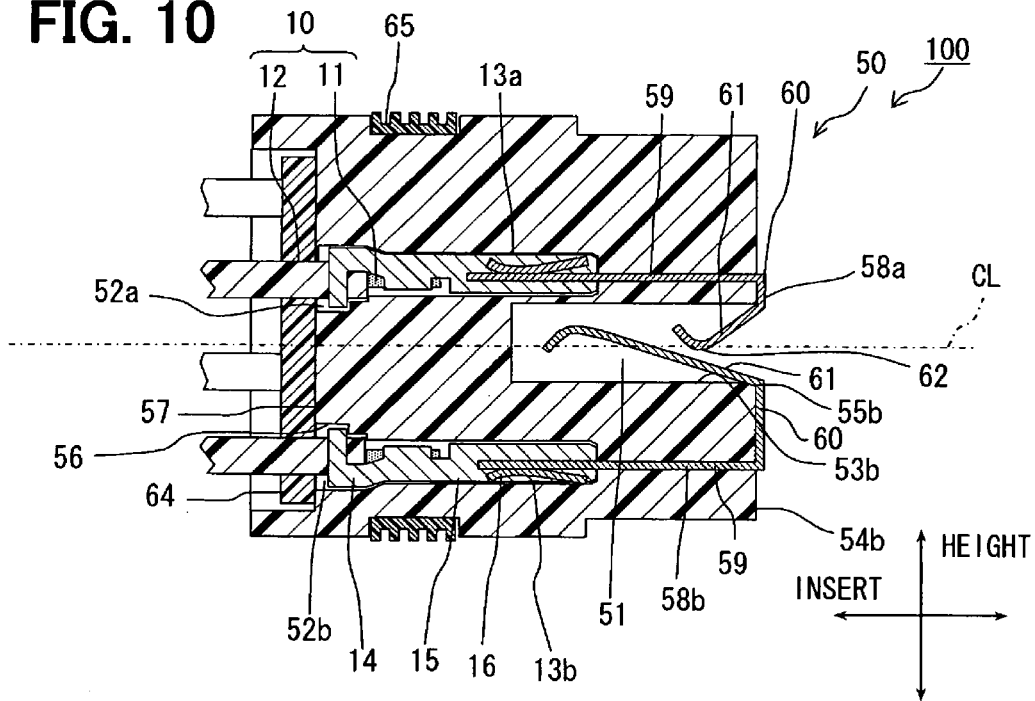
FIG. 10 is a diagram showing a cross sectional view of the card edge connector according to the modification of the first embodiment.

In the present embodiment, the junction, terminal 58 includes the first junction terminal 58a and the second junction terminal 58b. One of the first junction terminals 58a electrically connects between the first contact electrode 32a on the front surface 30a and the first terminal 13a disposed on the upper side in the height direction in FIGS. 6 and 7. The other of the first junction terminals 58a electrically connects between the first contact electrode 32a on the backside surface 30b and the first terminal 13a disposed on the lower side in the height direction in FIGS. 6 and 7. One of the second junction terminals 58b electrically connects between the second contact electrode 32b on the front surface 30a and the second terminal 13b disposed on the upper side in the height direction in FIGS. 6 and 7. The other of the second junction terminals 58b electrically connects between the second contact electrode 32b on the backside surface 30b and the second terminal 13b disposed on the lower side in the height direction in FIGS. 6 and 7. Alternatively, as shown in FIGS. 9 and 10, one of the first junction terminals 58a may electrically connect between the second contact electrode 32b on the front surface 30a and the first terminal 13a disposed on the upper side in the height direction in FIGS. 6 and 7. The other of the first junction terminals 58a may electrically connect between the second contact electrode 32b on the backside surface 30b and the first terminal 13a disposed on the lower side in the height direction in FIGS. 6 and 7. One of the second junction terminals 58b may electrically connect between the first contact electrode 32a on the front surface 30a and the second terminal 13b disposed on the upper side in the height direction in FIGS. 6 and 7. The other of the second junction terminals 58b may electrically connect between the first contact electrode 32a on the backside surface 30b and the second terminal 13b disposed on the lower side in the height direction in FIGS. 6 and 7. In this case, the arrangement range of the electrode contact portion 61 of the second junction terminal 58b to contact with the first contact electrode 32a on the front surface 30a, the arrangement range being in the board insertion opening 51 along with the insertion direction, at least partially overlaps with the arrangement range of the electrode contact portion 61 of the first junction terminal 58a to contact with the second contact electrode 32b on the front surface 30a, the arrangement range being in the board insertion opening 51 along with the insertion direction. Similarly, the arrangement range of the electrode contact portion 61 of the second junction terminal 58b to contact with the-first contact electrode 32a on the backside surface 30b, the arrangement range being in the board insertion opening 51 along with the insertion direction, at least partially overlaps with the arrangement range of the electrode contact portion 61 of the first junction terminal 58a to contact with the second contact electrode 32b on the backside surface 30b, the arrangement range being in the board insertion opening 51 along with the insertion direction. Thus, the length of the board insertion opening 51 is reduced, compared with a case where the arrangement range of the electrode contact portion 61 of the first junction terminal 58a in the board insertion opening 51 along with the insertion direction is separated from the arrangement range of the electrode contact portion 61 of the second junction terminal 58b in the board insertion opening 51 along with the insertion direction. When the length of the board insertion opening 51 is short, the range of the board 30 to be inserted into the board insertion opening 51 is small. Thus, the dimensions of the board 30 are reduced. FIGS. 9 and 10 show another card edge connector 100 according to a modification of the present embodiment.

In FIGS. 9 and 10, since both of the first and second junction terminals 58*a*, 58*b* are press-inserted into the fine hole 66, which opens on the second housing surface 54*b*, the insertion process is simplified, compared with a case where the first junction terminal 58*a* is press-inserted into the fine hole 66, which opens on the first housing surface 54*a*, and the second junction terminal 58*b* is press-inserted into the fine hole 66, which opens on the second housing surface 54*b*.

Figure 11:
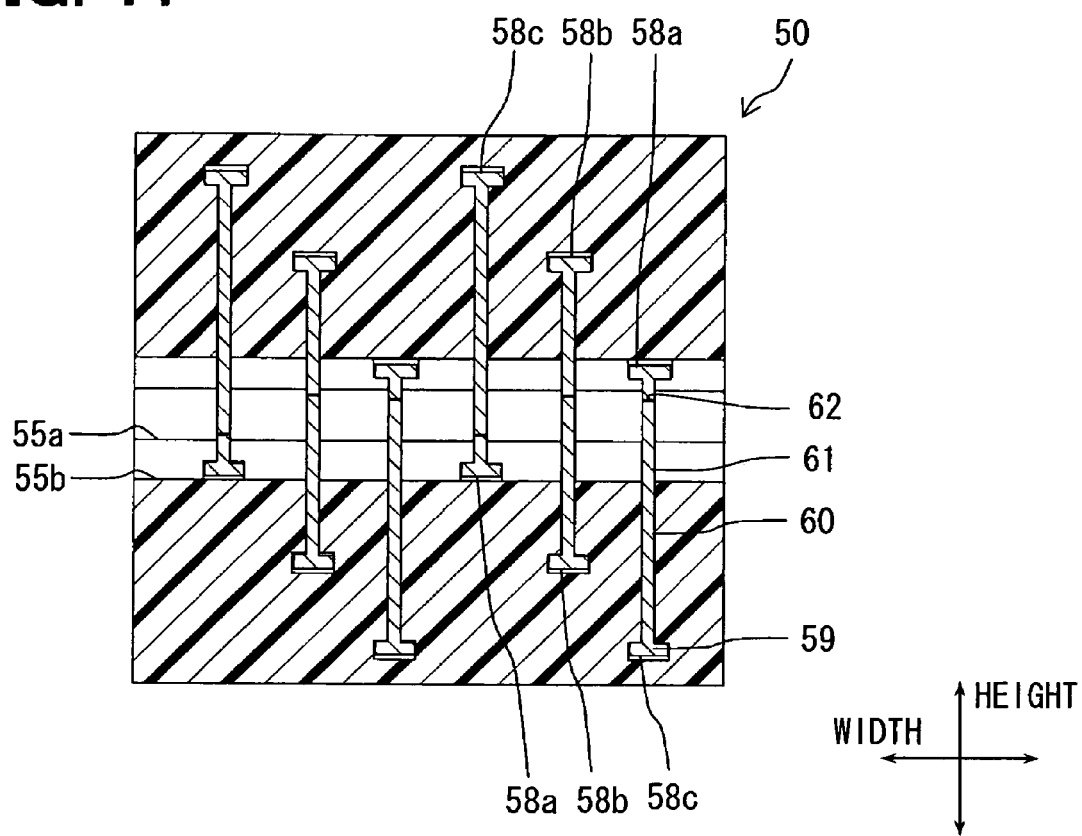
FIG. 11 is a diagram showing a cross sectional view of a junction terminal according to another modification of the first embodiment.
Figure 12:
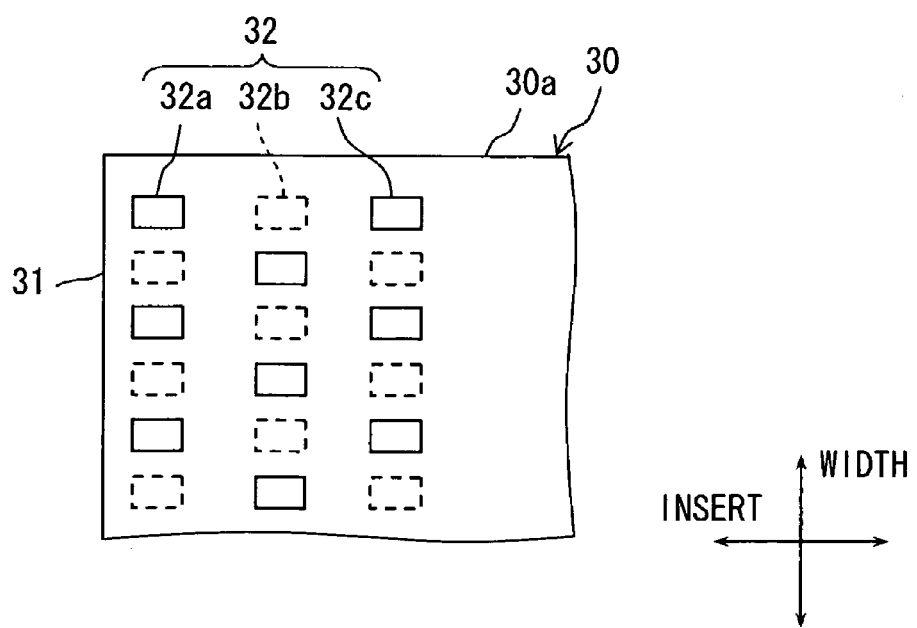
FIG. 12 is a diagram showing a plan view of arrangement of a contact electrode of the electric circuit board according to another modification of the first embodiment.

Further, as shown in FIG. 11, the junction terminal 58 may include the first to third junction terminals 58*a*, 58*b*, 58*c*. The third junction terminal 58*c* is spaced apart from the front or backside surface 30*a*, 30*b* of the board 30 further than the second terminal 13*b*. In this case, the number of the connection signal lines in the card edge connector 100 increases, compared with a case where the contact electrode 32 includes the first and second contact electrodes 32*a*, 32*b*. Further, in this case, as shown in FIG. 12, the contact electrode 32 includes the first to third contact electrodes 32*a*, 32*b*, 32*c*. The third contact electrode 32*c* is spaced apart from the insertion end 31 further than the second contact electrode 32*b*. The third junction terminal 58*c* is electrically connected to the third contact electrode 32*c*. The distance between two adjacent first contact electrodes 32*a*, which are disposed in the lateral direction and sandwich one second contact electrode 32*b* and one third contact electrode 32*c*, is determined such that the electrode contact portion of the junction terminal 58 to contact with the second contact electrode 32*b* does not contact with the first contact electrode 32*a*, and further, the electrode contact portion of the junction terminal 58 to contact with the third contact electrode 32*c* does not contact with the first contact electrode 32*a* when the board 30 is inserted into the board insertion opening 51. The distance between the first and second contact electrodes 32*a*, 32*b*, which are adjacently disposed in the lateral direction and sandwich one third contact electrode 32*c*, is determined such that the electrode contact portion 61 of the junction terminal 58 to contact with the third contact electrode 32*c* does not contact with both of the first and second contact electrodes 32*a*, 32*b* when the board 30 is inserted into the board insertion opening 51. FIG. 11 shows the junction terminal according to another modification of the present embodiment. FIG. 12 shows an arrangement of the contact electrodes 32*a*-32*c* on the board 30 according to the other modification of the present embodiment. In FIG. 12; the contact electrode 32 on the backside surface 30*b* is shown as a broken line.

Second Embodiment

Figure 13:
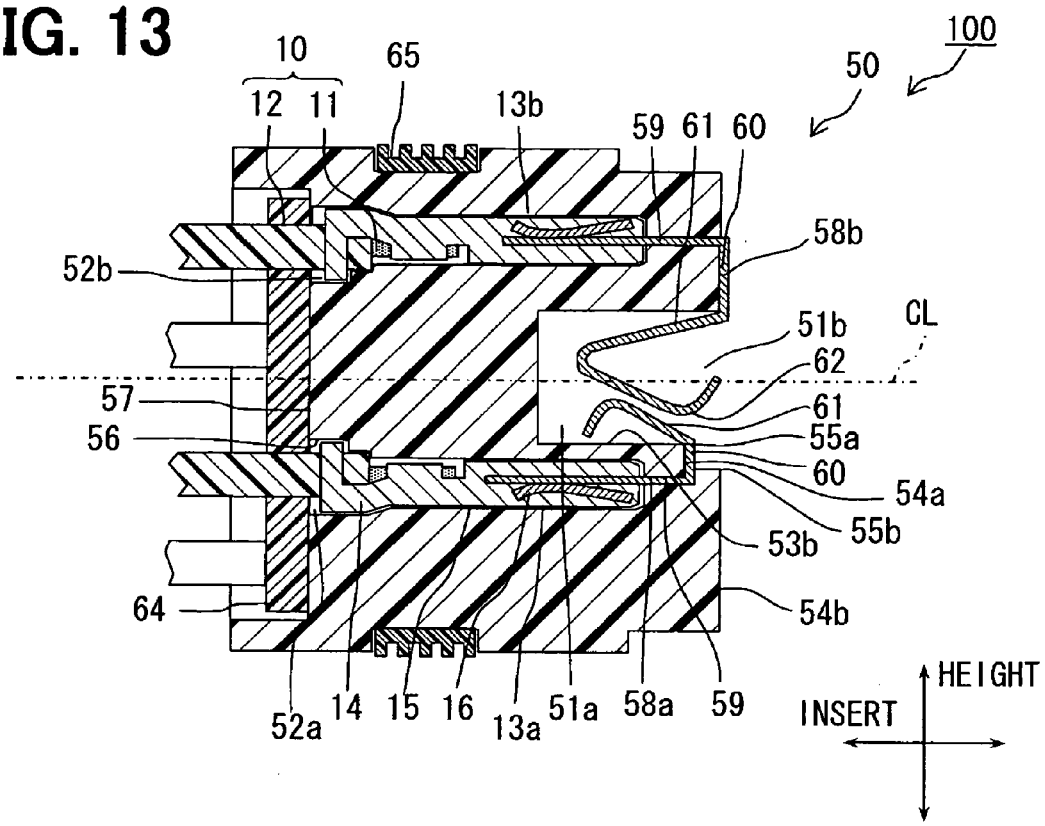
FIG. 13 is a diagram showing a cross sectional view of a junction terminal of a card edge connector according to a second embodiment.
Figure 14:
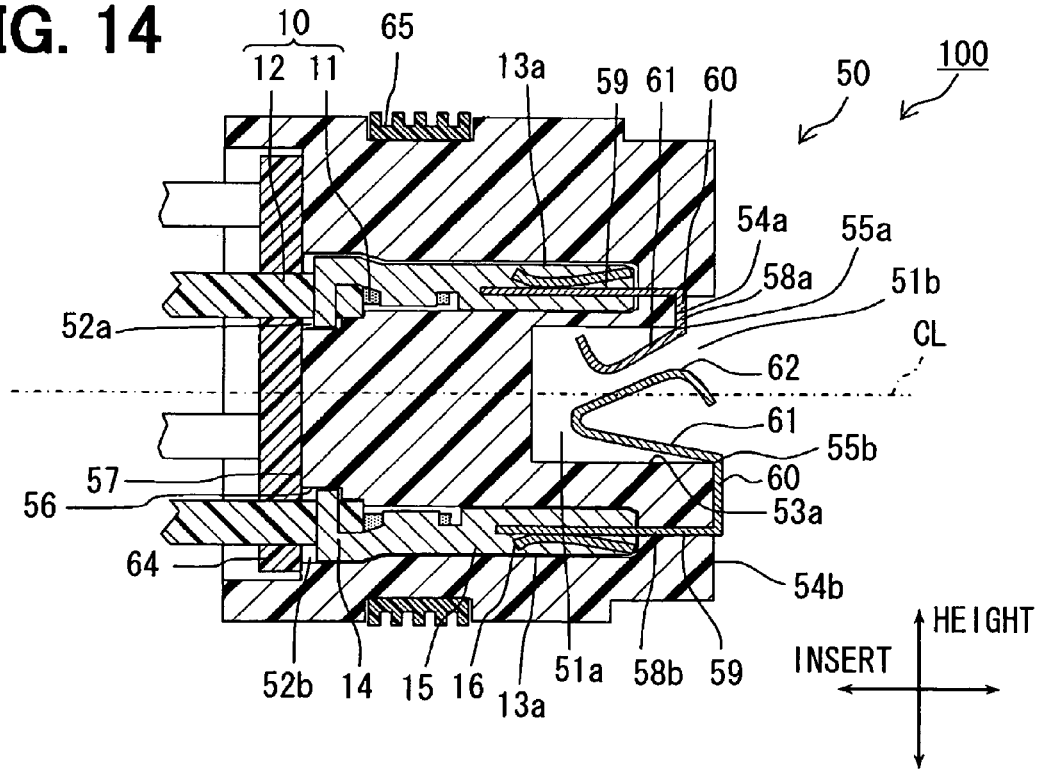
FIG. 14 is a diagram showing a cross sectional view of the junction terminal of the card edge connector according to the second embodiment.

A card edge connector 100 according to a second embodiment is shown in FIGS. 13 and 14.

In the connector 100 in FIGS. 13 and 14, the electrode contact portion 61 of the second junction terminal 58*b* is bent twice along with the insertion direction of the board 30 in the board insertion opening 51 and the direction opposite to the insertion direction, respectively. Specifically, the electrode contact portion 61 of the second junction terminal 58*b* is bent at a connection point between the connection portion 60 and the contact portion 61 as a pivot point toward the insertion direction once. Further, the electrode contact portion 61 of the second junction terminal 58*b* is bent at a turn-back point, i.e., a folding back point as a pivot point toward a direction opposite to the insertion direction of the board 30 once.

The contact pressure between the contact electrode 32 and the electrode contact portion 61 is in inverse proportion to the length of a part of the electrode contact portion 61, which is elastically deformed. Further, the contact pressure is in proportion to a stroke of elastic deformation of the part of the electrode contact portion 61. Accordingly, when the elastically deformable part of the electrode contact portion 61 is short, the variation of the contact pressure with respect to the stroke of the elastic deformation is large. When the elastically deformable part of the electrode contact portion 61 is long, the variation of the contact pressure with respect to the stroke of the elastic deformation is small. It is necessary to maintain the contact pressure within a predetermined range so as to secure the reliability of electric connection between the contact electrode 32 and the electrode contact portion 61. Thus, it is necessary to lengthen the elastically deformable part of the electrode contact portion 61 in order to maintain the contact pressure within the predetermined range and in order to absorb manufacturing tolerance of the board 30, the housing 50, the contact electrode 32 and the like. The length of the board insertion opening 51, which corresponds to an inserted part of the board 30, depends on the length of the elastically deformed part of the electrode contact portion 61. Accordingly, it is necessary to lengthen the board insertion opening 51 in order to maintain the contact pressure between the contact electrode 32 and the electrode contact portion 61 within a predetermined range. As a result, an insertion part of the board 30 to be inserted into the board insertion opening 51 is also lengthened. Here, it is difficult to form an electric element on the insertion part of the board 30 since a clearance between the board 30 and the inner wall of the board insertion opening 51 is small. Accordingly, the length of the board insertion opening 51 is lengthened in order to maintain the contact pressure between the contact electrode 32 and the electrode contact portion 61 within the predetermined range. Further, the insertion part of the board 30 to be inserted into the board insertion opening 51 is enlarged. Thus, the dimensions of the board 30 become large.

However, in the present embodiment, the electrode contact portion 61 of the second junction terminal 58*b* is bent once toward the insertion direction of the board into the board insertion opening 51, and further, bent once toward the direction opposite to the insertion direction. Thus, since the electrode contact portion 61 is bent twice, the length of the electrode contact portion 61 in the insertion direction is reduced, and the contact pressure between the contact electrode 32 and the electrode contact portion 61 is easily maintained within the predetermined range, compared with a case where the electrode contact portion 61 is bent once in the insertion direction. Thus, the length of the board insertion opening 51 is shortened. Thus, the insertion part of the board 30 to be inserted into the board insertion opening 51 is shortened. Therefore, the dimensions of the board 30 are reduced.

In the present embodiment, before the board 30 is inserted into the board insertion opening 51, a linear part of the electrode contact portion 61 of the first junction terminal 58*a*, which is disposed from a connection point with the connection portion 60 to the top 62, is substantially in parallel to a linear part of the electrode contact portion 61 of the second junction terminal 58*b*, which is disposed from a turn-back point to the top 62. In this case, since the electrode contact portion 61 of the first junction terminal 58*a* is disposed near the electrode contact portion 61 of the second junction terminal 58*b*, the dimensions of a part of the board insertion opening 51 for accommodating the electrode contact portion 61 are reduced.

In the present embodiment, a part of the board insertion opening 51 in the insertion direction, at which the electrode contact portion 61 of the first junction terminal 58*a* contacting the first contact electrode 32a on the front surface 30a is disposed, partially overlaps with a part of the board insertion opening 51 in the insertion direction, at which the electrode contact portion 61 of the second junction terminal 58b contacting the second contact electrode 32b on the front surface 30a is disposed. Further, a part of the board insertion opening 51 in the insertion direction, at which the electrode contact portion 61 of the first junction terminal 58a contacting the first contact electrode 32a on the backside surface 30b is disposed, partially overlaps with a part of the board insertion opening 51 in the insertion direction, at which the electrode contact portion 61 of the second junction terminal 58b contacting the second contact electrode 32b on the backside surface 30b is disposed. Thus, the length of the board insertion opening 51 is shortened, compared with a case where a part of the board insertion opening 51 in the insertion direction, at which the electrode contact portion 61 of the first junction terminal 58a is disposed, is separated from a part of the board insertion opening 51 in the insertion direction, at which the electrode contact portion 61 of the second junction terminal 58b is disposed.

Figure 15:
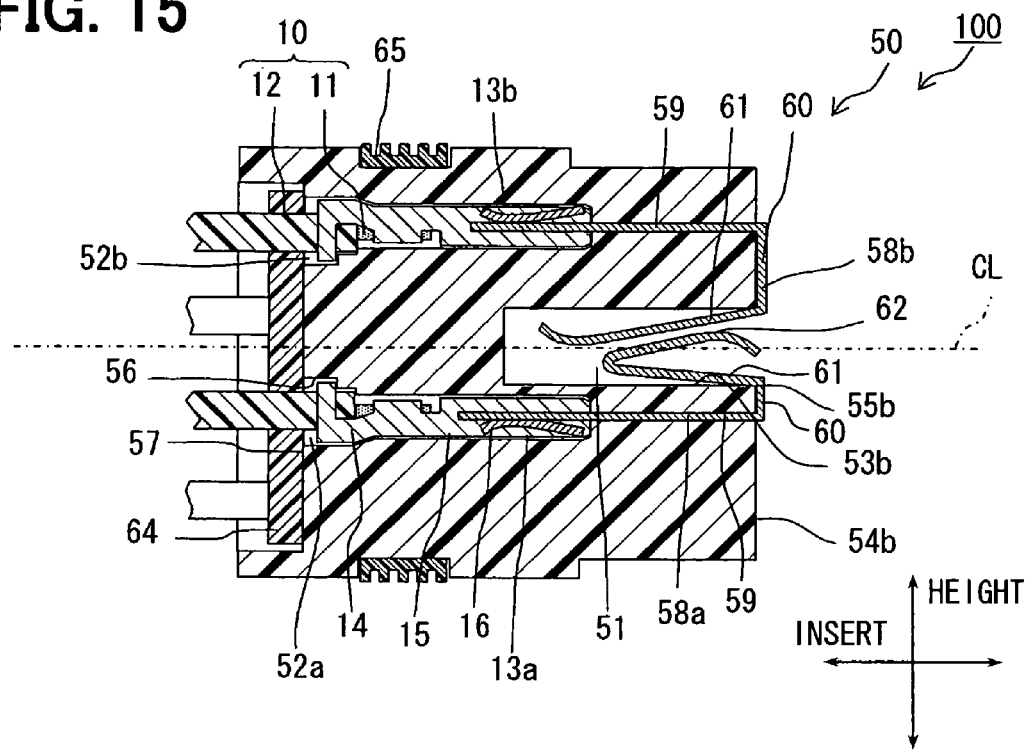
FIG. 15 is a diagram showing a cross sectional view of a card edge connector according to a modification of the first and second embodiments.
Figure 16:
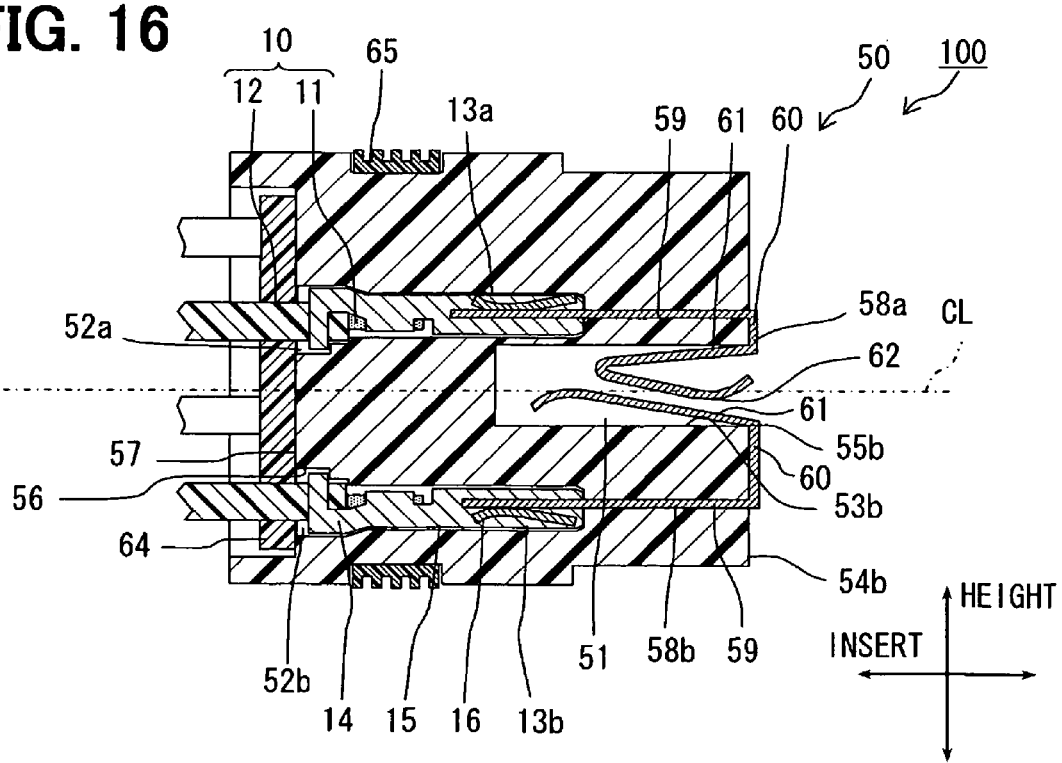
FIG. 16 is a diagram showing a cross sectional view of the card edge connector according to the modification of the first and second embodiments.

In the present embodiment, the junction terminal 58 includes the first junction terminal 58a and the second junction terminal 58b. The first junction terminal 58a is electrically coupled between the first contact electrode 32a on the front or backside surface 30a, 30b and the first terminal 13a. The second junction terminal 58b is electrically coupled between the second contact electrode 32b on the front or backside surface 30a, 30b and the second terminal 13b. Alternatively, as shown in FIGS. 15 and 16, the first junction terminal 58a may be electrically coupled between the second contact electrode 32b on the front or backside surface 30a, 30b and the first terminal 13a. The second junction terminal 58b may be electrically coupled between the first contact electrode 32a on the front or backside surface 30a, 30b and the second terminal 13b. FIGS. 15 and 16 show a card edge connector according to a modification of the present embodiment.

In FIGS. 13 and 14, one end of the second junction terminal 58b in the board insertion opening 51 is disposed on the opening side of the board insertion opening 51 from the top 62. In this case, when the center line CL is arranged between the top 62 of the second junction terminal 58b and the connection portion 60, it is preferred that the one end of the second junction terminal 58b in the board insertion opening 51 is arranged on the connection portion side, and crosses the center line CL. In this case, when the board is inserted along with the center line CL, a part of the second junction terminal 58b between the top 62 of the second junction terminal 58b and the one end of the second junction terminal 58b in the board insertion opening 51 contacts with the board 30. Accordingly, when the board 30 is completely inserted into the board insertion opening 51, the electrode contact portion 61 of the second junction terminal 58b is surely press-inserted on the connection portion side.

In FIGS. 15 and 16, when the center line CL is disposed between the top 62 of the first junction terminal 58a and the connection portion 60, it is preferred that one end of the first junction terminal 58a on the board insertion opening side is arranged on the connection portion side, and crosses the center line CL.

In the present embodiment, the electrode contact portion 61 is bent twice. Alternatively, the number of bending the electrode contact portion 61 may be one or more.

The above disclosure has the following aspects.

According to a first aspect of the present disclosure, a card edge connector for electrically coupling between one of a plurality of contact electrodes of an electric circuit board and a corresponding harness connecting to an external circuit, the connector includes: a housing including a board insertion opening, into which one end of the electric circuit board is inserted along with an insertion direction; a plurality of harness terminals disposed in the housing, wherein each harness terminal is coupled with a corresponding harness; and a plurality of junction terminals disposed in the housing, wherein each junction terminal includes a first end contacting a corresponding contact electrode and a second end contacting a corresponding harness terminal. The plurality of contact electrodes disposed on the electric circuit board and includes a plurality of first contact electrodes and a plurality of second contact electrodes. A distance between each first contact electrode and the one end of the electric circuit board is smaller than a distance between each second contact electrode and the one end of the electric circuit board. A predetermined number of the plurality of first contact electrodes is disposed on a first surface of the electric circuit board, and a remaining number of the plurality of first contact electrodes is disposed on a second surface of the electric circuit board. A predetermined number of the plurality of second contact electrodes is disposed on the first surface of the electric circuit board, and a remaining number of the plurality of second contact electrodes is disposed on the second surface of the electric circuit board. The predetermined number of the plurality of first contact electrodes and the predetermined number of the plurality of second contact electrodes are aligned on the first surface alternately along with a width direction of the electric circuit board perpendicular to the insertion direction so that one of the plurality of first contact electrodes on the first surface and one of the plurality of second contact electrodes on the first surface are displaced in the width direction. The remaining number of the plurality of first contact electrodes and the remaining number of the plurality of second contact electrodes are aligned on the second surface alternately along with the width direction of the electric circuit board perpendicular to the insertion direction so that one of the plurality of first contact electrodes on the second surface and one of the plurality of second contact electrodes on the second surface are displaced in the width direction. One of the plurality of first contact electrodes on the first surface and one of the plurality of second contact electrodes on the second surface are aligned along with the insertion direction to sandwich the electric circuit board, and another one of the plurality of first contact electrodes on the second surface and another one of the plurality of second contact electrodes on the first surface are aligned along with the insertion direction to sandwich the electric circuit board. The first end of one of the plurality of junction terminals contacting a corresponding contact electrode on the first surface extends from a first inner wall of the board insertion opening to reach a centerline of the electric circuit board. The first inner wall faces the first surface. The second end of another one of the plurality of junction terminals contacting a corresponding contact electrode on the second surface extends from a second inner wall of the board insertion opening to reach the centerline of the electric circuit board. The second inner wall faces the second surface.

In the above card edge connector, the first and second contact electrodes on the same surface are not aligned in the insertion direction, but displaced in the width direction perpendicular to the insertion direction. The first contact electrode on one surface of the board and the second contact electrode on the other surface of the board sandwiching the board are aligned in the insertion direction. Thus, the first end of the junction terminal contacting the contact electrode on one surface of the board and the first end of the junction terminal contacting the contact electrode on the other surface of the board are space apart from each other by a certain distance in the insertion direction. Thus, the first end of the junction terminal contacting the contact electrode on one surface of the board and the first end of the junction terminal contacting the contact electrode on the other surface of the board are restricted from contacting with each other. Further, before the board is inserted into the board insertion opening, the first end of the junction terminal extends from the first or second inner wall of the board insertion opening to reach the centerline of the electric circuit board. Thus, the elastic deformation distance of the junction terminal is equal to or larger than a half of the thickness of the board. The contact pressure between the junction terminal and the board is sufficient. Thus, robustness of the card edge connector with respect to arrangement tolerance and robustness with respect to electric connection are improved. The electric coupling between the junction terminal and the contact electrode is improved.

Alternatively, the plurality of harness terminals may include a predetermined number of first harness terminals and a remaining number of second harness terminals. A distance between each first harness terminal and the electric circuit board in a height direction perpendicular to the electric circuit board is smaller than a distance between each second harness terminal and the electric circuit board in the height direction. The plurality of junction terminals includes a predetermined number of first junction terminals and a remaining number of second junction terminals. Each first junction terminal electrically couples between a corresponding first harness; terminal and a corresponding first or second contact electrode, and each second junction terminal electrically couples between a corresponding second harness terminal and a corresponding first or second contact electrode. In this case, the first harness terminal is separated from the second harness terminal by a sufficient distance therebetween in the height direction. Thus, the card edge connector provides a multi-stage connector. The first and second harness terminals electrically couple with the contact electrode via the first and second junction terminals, respectively. Thus, the connector provides to couple the same type of terminals having the same structure with the harness, compared with a case where the connector provides to couple two types of terminals having different structures with the harness. The manufacturing cost is reduced.

Alternatively, each of the first harness terminals and the second harness terminals may include a body portion and a contact portion. The body portion has a columnar shape. The contact portion is disposed in the body portion, and the contact portion is elastically deformable so that the contact portion press-contacts with the second end of a corresponding junction terminal with a predetermined contact pressure. In this case, the harness terminal is a female terminal. When the harness terminal is inserted into the terminal insertion opening, it is not necessary to accommodate the contact portion in the body. Accordingly, the harness terminal is easily inserted into the terminal insertion opening.

Alternatively, the card edge connector further includes an assembled seal member for sealing a clearance between the housing and each harness. In this case, it is not necessary to attach an individual seal member in each harness. Thus, the manufacturing cost is reduced. Further, it is not necessary to form space for attaching the individual seal member. Thus, the dimensions of the connector are reduced.

Alternatively, each first junction terminal may include a first electrode contact portion, and each second junction terminal includes a second electrode contact portion. The first electrode contact portion extends along with the insertion direction. The first electrode contact portion is elastically deformable so that the first electrode contact portion press-contacts with a corresponding contact electrode. The second electrode contact portion extends along with the insertion direction. The second electrode contact portion is elastically deformable so that the second electrode contact portion press-contacts with a corresponding contact electrode, and the first electrode contact portion exposed in the board insertion opening is partially disposed over the second electrode contact portion exposed in the board insertion opening so that a part of the first electrode contact portion overlaps over a part of the second electrode contact portion in the insertion direction. When the board is inserted into the board insertion opening, the first and second contact portions are elastically deformed so that the contact pressure between the contact portion and the contact electrode is maintained within a predetermined range. Since the first electrode contact portion exposed in the board insertion opening is partially disposed over the second electrode contact portion exposed in the board insertion opening so that a part of the first electrode contact portion overlaps over a part of the second electrode contact portion in the insertion direction, the length of the board insertion opening is reduced. The dimensions of the board are small.

Alternatively, each junction terminal may include a harness terminal contact portion, a connection portion and an electrode contact portion. The harness terminal contact portion is disposed in the housing and extends from a housing surface of the housing to the harness terminal. The connection portion is connected to one end of the harness terminal contact portion, which is disposed on the housing surface. The connection portion extends from the one end of the harness terminal contact portion to one end of the connection portion along with the housing surface. The one end of the connection portion is disposed in the board insertion opening. The electrode contact portion is coupled with the one end of the connection portion. The electrode contact portion protrudes from the housing surface in the board insertion opening, and the electrode contact portion is bent once toward the insertion direction, and further bent once toward a direction opposite to the insertion direction. Since the electrode contact portion is bent twice, the length of the electrode contact portion is reduced. Further, the contact pressure between the contact electrode and the electrode contact portion is easily controlled within the predetermine range. Thus, the length of the board insertion opening is shortened. The dimensions of the board are reduced.

Alternatively, each junction terminal may include a harness terminal contact portion, a connection portion and an electrode contact portion. The harness terminal contact portion is disposed in the housing and extends from a housing surface of the housing to the harness terminal. The connection portion is connected to one end of the harness terminal contact portion, which is disposed on the housing surface. The connection portion extends from the one end of the harness terminal contact portion to one end of the connection portion along with the housing surface. The one end of the connection portion is disposed in the board insertion opening. The electrode contact portion is coupled with the one end of the connection portion. The electrode contact portion protrudes from the housing surface in the board insertion opening. The electrode contact portion of one of the junction terminals is bent once toward the insertion direction at the one end of the connection portion as a pivot point. The electrode contact portion of another one of the junction terminals is bent once toward the insertion direction at the one end of the connection portion as a pivot point, and further bent once toward a direction opposite to the insertion direction at a turn-back point of the electrode contact portion as another pivot point. A part of the electrode contact portion of the one of the junction terminals is disposed between the one end of the connection portion and a contact point of the one of the junction terminals contacting a corresponding contact electrode. A part of the electrode contact portion of the other one of the junction terminals is disposed between the one end of the connection portion and a contact point of the one of the junction terminals contacting a corresponding contact electrode. The part of the electrode contact portion of the one of the junction terminals has a linear shape, and the part of the electrode contact portion of the other one of the junction terminals has a linear shape, and the part of the electrode contact portion of the one of the junction terminals is in parallel to the part of the electrode contact portion of the other one of the junction terminals. In this case, an arrangement space in the board insertion opening for the electrode contact portion is reduced since the electrode contact portion of the one of the junction terminals and the electrode contact portion of the other one of the junction terminals are arranged proximately.

Alternatively, each junction terminal may include a harness terminal contact portion, a connection portion and an electrode contact portion. The harness terminal contact portion is disposed in the housing and extends from a housing surface of the housing to the harness terminal. The connection portion is connected to one end of the harness terminal contact portion, which is disposed on the housing surface. The connection portion extends from the one end of the harness terminal contact portion to one end of the connection portion along with the housing surface. The one end of the connection portion is disposed in the board insertion opening. The electrode contact portion is coupled with the one end of the connection portion. The electrode contact portion protrudes from the housing surface in the board insertion opening. The electrode contact portion is deformable so that a connection angle between the connection portion and the electrode contact portion is changed so as to generate a contact pressure with respect to a corresponding contact electrode when the electric circuit board is inserted into the board insertion opening of the housing, and each of the first inner wall and the second inner wall of the board insertion opening includes a convexity for supporting a corresponding electrode contact portion so that the connection angle between the connection portion and the electrode contact portion is constant. In this case, the connection angle is stably controlled so that the contact between the terminal contact portion and the contact electrode is stabilized. Thus, electric connection between the terminal contact portion and the contact electrode is improved.

According to a second aspect of the present disclosure, a method for assembling the card edge connector according to the first aspect of the present disclosure is provided. Each junction terminal includes a harness terminal contact portion, a connection portion and an electrode contact portion. The harness terminal contact portion is disposed in the housing and extends from a housing surface of the housing to the harness terminal. The connection portion is connected to one end of the harness terminal contact portion, which is disposed on the housing surface. The connection portion extends from the one end of the harness terminal contact portion to one end of the connection portion along with the housing surface. The one end of the connection portion is disposed in the board insertion opening. The electrode contact portion is coupled with the one end of the connection portion. The electrode contact portion protrudes from the housing surface in the board insertion opening. The housing is made of resin, and formed by an injection molding method. The housing further includes a fine hole and a terminal insertion opening. The harness terminal is inserted into the terminal insertion opening. The fine hole extends from the housing surface to the terminal insertion opening. The method includes: press-inserting the harness terminal contact portion into the fine hole in such a manner that a part of the harness terminal contact portion is disposed in the terminal insertion opening; inserting the harness terminal into the terminal insertion opening; and inserting the electric circuit board into the board insertion opening.

In the above method, the first and second contact electrodes on the same surface are not aligned in the insertion direction, but displaced in the width direction perpendicular to the insertion direction. The first contact electrode on one surface of the board and the second contact electrode on the other surface of the board sandwiching the board are aligned in the insertion direction. Thus, the first end of the junction terminal contacting the contact electrode on one surface of the board and the first end of the junction terminal contacting the contact electrode on the other surface of the board are space apart from each other by a certain distance in the insertion direction. Thus, the first end of the junction terminal contacting the contact electrode on one surface of the board and the first end of the junction terminal contacting the contact electrode on the other surface of the board are restricted from contacting with each other. Further, before the board is inserted into the board insertion opening, the first end of the junction terminal extends from the first or second inner wall of the board insertion opening to reach the centerline of the electric circuit board. Thus, the elastic deformation distance of the junction terminal is equal to or larger than a half of the thickness of the board. The contact pressure between the junction terminal and the board is sufficient. Thus, robustness of the card edge connector with respect to arrangement tolerance and robustness with respect to electric connection are improved. The electric coupling between the junction terminal and the contact electrode is improved.

Alternatively, the press-inserting the harness terminal contact portion may include forming a tab on the one end of the harness terminal contact portion, and the tab applies pressure to the harness terminal contact portion. The method further includes: removing the tab from the one end of the harness terminal contact portion after the press-inserting the harness terminal contact portion. In this case, the deformation of the terminal contact portion is restricted, so that the electric connection between the terminal contact portion and the contact portion, and the electric connection between the electrode contact portion and the contact electrode are improved.

Alternatively, the method may further include: forming a barb having a tapered shape on a part of the harness terminal contact portion, which is inserted into the fine hole. The fine hole includes an inner wall having a protrusion, which is engaged with the barb. The mechanical connection between the terminal contact portion and the housing is strong. Thus, electric connection between the terminal contact portion and the contact portion, and the electric connection between the electrode contact portion and the contact electrode are improved.

Alternatively, the method may further include: forming an assembled seal member for sealing a clearance between the housing and each harness. Each of the first harness terminals and the second harness terminals includes a body portion and a contact portion. The body portion has a columnar shape. The contact portion is disposed in the body portion. The contact portion is elastically deformable so that the contact portion press-contacts with a corresponding electrode contact portion with a predetermined contact pressure, and the harness terminal penetrates the assembled seal member so that the harness terminal is inserted into the terminal insertion opening. In this case, it is not necessary to attach an individual seal member in each harness. Thus, the manufacturing cost is reduced. Further, it is not necessary to form space for attaching the individual seal member. Thus, the dimensions of the connector are reduced.

According to a third aspect of the present disclosure, a method for assembling the card edge connector according to the first aspect of the present disclosure is provided. The method includes: forming the housing from resin by an injection molding method so that the junction terminal is insert-molded in the housing; inserting the harness terminal into the terminal insertion opening; and inserting the electric circuit board into the board insertion opening.

In the above method, the first and second contact electrodes on the same surface are not aligned in the insertion direction, but displaced in the width direction perpendicular to the insertion direction. The first contact electrode on one surface of the board and the second contact electrode on the other surface of the board sandwiching the board are aligned in the insertion direction. Thus, the first end of the junction terminal contacting the contact electrode on one surface of the board and the first end of the junction terminal contacting the contact electrode on the other surface of the board are space apart from each other by a certain distance in the insertion direction. Thus, the first end of the junction terminal contacting the contact electrode on one surface of the board and the first end of the junction terminal contacting the contact electrode on the other surface of the board are restricted from contacting with each other. Further, before the board is inserted into the board insertion opening, the first end of the junction terminal extends from the first or second inner wall of the board insertion opening to reach the centerline of the electric circuit board. Thus, the elastic deformation distance of the junction terminal is equal to or larger than a half of the thickness of the board. The contact pressure between the junction terminal and the board is sufficient. Thus, robustness of the card edge connector with respect to arrangement tolerance and robustness with respect to electric connection are improved. The electric coupling between the junction terminal and the contact electrode is improved.

Alternatively, the method may further include: forming an assembled seal member for sealing a clearance between the housing and each harness. Each of the first harness terminals and the second harness terminals includes a body portion and a contact portion. The body portion has a columnar shape. The contact portion is disposed in the body portion. The contact portion is elastically deformable so that the contact portion press-contacts with a corresponding electrode contact portion with a predetermined contact pressure, and the harness terminal penetrates the assembled seal member so that the harness terminal is inserted into the terminal insertion opening. In this case, it is not necessary to attach an individual seal member in each harness. Thus, the manufacturing cost is reduced. Further, it is not necessary to form space for attaching the individual seal member. Thus, the dimensions of the connector are reduced.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A card edge connector for electrically coupling between one of a plurality of contact electrodes of an electric circuit board and a corresponding harness connecting to an external circuit, the connector comprising:

a housing including a board insertion opening, into which one end of the electric circuit board is inserted along with an insertion direction;

a plurality of harness terminals disposed in the housing, wherein each harness terminal is coupled with a corresponding harness; and a plurality of junction terminals disposed in the housing, wherein each junction terminal includes a first end contacting a corresponding contact electrode and a second end contacting a corresponding harness terminal, wherein the plurality of contact electrodes disposed on the electric circuit board and includes a plurality of first contact electrodes and a plurality of second contact electrodes, wherein a distance between each first contact electrode and the one end of the electric circuit board is smaller than a distance between each second contact electrode and the one end of the electric circuit board, wherein a predetermined number of the plurality of first contact electrodes is disposed on a first surface of the electric circuit board, and a remaining number of the plurality of first contact electrodes is disposed on a second surface of the electric circuit board, wherein a predetermined number of the plurality of second contact electrodes is disposed on the first surface of the electric circuit board, and a remaining number of the plurality of second contact electrodes is disposed on the second surface of the electric circuit board, wherein the predetermined number of the plurality of first contact electrodes and the predetermined number of the plurality of second contact electrodes are aligned on the first surface alternately along with a width direction of the electric circuit board perpendicular to the insertion direction so that one of the plurality of first contact electrodes on the first surface and one of the plurality of second contact electrodes on the first surface are displaced in the width direction, wherein the remaining number of the plurality of first contact electrodes and the remaining number of the plurality of second contact electrodes are aligned on the second surface alternately along with the width direction of the electric circuit board perpendicular to the insertion direction so that one of the plurality of first contact electrodes on the second surface and one of the plurality of second contact electrodes on the second surface are displaced in the width direction, wherein one of the plurality of first contact electrodes on the first surface and one of the plurality of second contact electrodes on the second surface are aligned along with the insertion direction to sandwich the electric circuit board, and another one of the plurality of first contact electrodes on the second surface and another one of the plurality of second contact electrodes on the first surface are aligned along with the insertion direction to sandwich the electric circuit board, wherein the first end of one of the plurality of junction terminals contacting a corresponding contact electrode on the first surface extends from a first inner wall of the board insertion opening to reach a center line of the electric circuit board, wherein the first inner wall faces the first surface, wherein the second end of another one of the plurality of junction terminals contacting a corresponding contact electrode on the second surface extends from a second inner wall of the board insertion opening to reach the center line of the electric circuit board, and wherein the second inner wall faces the second surface.

2. The card edge connector according to claim 1, wherein the plurality of harness terminals includes a predetermined number of first harness terminals and a remaining number of second harness terminals, wherein a distance between each first harness terminal and the electric circuit board in a height direction perpendicular to the electric circuit board is smaller than a distance between each second harness terminal and the electric circuit board in the height direction, wherein the plurality of junction terminals includes a predetermined number of first junction terminals and a remaining number of second junction terminals, wherein each first junction terminal electrically couples between a corresponding first harness terminal and a corresponding first or second contact electrode, and wherein each second junction terminal electrically couples between a corresponding second harness terminal and a corresponding first or second contact electrode.

3. The card edge connector according to claim 2, wherein each of the first harness terminals and the second harness terminals includes a body portion and a contact portion, wherein the body portion has a columnar shape, wherein the contact portion is disposed in the body portion, and wherein the contact portion is elastically deformable so that the contact portion press-contacts with the second end of a corresponding junction terminal with a predetermined contact pressure.

4. The card edge connector according to claim 3, further comprising:

an assembled seal member for sealing a clearance between the housing and each harness.

5. The card edge connector according to claim 2, wherein each first junction terminal includes a first electrode contact portion, and each second junction terminal includes a second electrode contact portion, wherein the first electrode contact portion extends along with the insertion direction, wherein the first electrode contact portion is elastically deformable so that the first electrode contact portion press-contacts with a corresponding contact electrode, wherein the second electrode contact portion extends along with the insertion direction, wherein the second electrode contact portion is elastically deformable so that the second electrode contact portion press-contacts with a corresponding contact electrode, and wherein the first electrode contact portion exposed in the board insertion opening is partially disposed over the second electrode contact portion exposed in the board insertion opening so that a part of the first electrode contact portion overlaps over a part of the second electrode contact portion in the insertion direction.

6. The card edge connector according to claim 1, wherein each junction terminal includes a harness terminal contact portion, a connection portion and an electrode contact portion, wherein the harness terminal contact portion is disposed in the housing and extends from a housing surface of the housing to the harness terminal, wherein the connection portion is connected to one end of the harness terminal contact portion, which is disposed on the housing surface, wherein the connection portion extends from the one end of the harness terminal contact portion to one end of the connection portion along with the housing surface, wherein the one end of the connection portion is disposed in the board insertion opening, wherein the electrode contact portion is coupled with the one end of the connection portion, wherein the electrode contact portion protrudes from the housing surface in the board insertion opening, and wherein the electrode contact portion is bent once toward the insertion direction, and further bent once toward a direction opposite to the insertion direction.

7. The card edge connector according to claim 1, wherein each junction terminal includes a harness terminal contact portion, a connection portion and an electrode contact portion, wherein the harness terminal contact portion is disposed in the housing and extends from a housing surface of the housing to the harness terminal, wherein the connection portion is connected to one end of the harness terminal contact portion, which is disposed on the housing surface, wherein the connection portion extends from the one end of the harness terminal contact portion to one end of the connection portion along with the housing surface, wherein the one end of the connection portion is disposed in the board insertion opening, wherein the electrode contact portion is coupled with the one end of the connection portion, wherein the electrode contact portion protrudes from the housing surface in the board insertion opening, wherein the electrode contact portion of one of the junction terminals is bent once toward the insertion direction at the one end of the connection portion as a pivot point, wherein the electrode contact portion of another one of the junction terminals is bent once toward the insertion direction at the one end of the connection portion as a pivot point, and further bent once toward a direction opposite to the insertion direction at a turn-back point of the electrode contact portion as another pivot point, wherein a part of the electrode contact portion of the one of the junction terminals is disposed between the one end of the connection portion and a contact point of the one of the junction terminals contacting a corresponding contact electrode, wherein a part of the electrode contact portion of the other one of the junction terminals is disposed between the one end of the connection portion and a contact point of the one of the junction terminals contacting a corresponding contact electrode, wherein the part of the electrode contact portion of the one of the junction terminals has a linear shape, and the part of the electrode contact portion of the other one of the junction terminals has a linear shape, and wherein the part of the electrode contact portion of the one of the junction terminals is in parallel to the part of the electrode contact portion of the other one of the junction terminals.

8. The card edge connector according to claim 1, wherein each junction terminal includes a harness terminal contact portion, a connection portion and an electrode contact portion, wherein the harness terminal contact portion is disposed in the housing and extends from a housing surface of the housing to the harness terminal, wherein the connection portion is connected to one end of the harness terminal contact portion, which is disposed on the housing surface, wherein the connection portion extends from the one end of the harness terminal contact portion to one end of the connection portion along with the housing surface, wherein the one end of the connection portion is disposed in the board insertion opening, wherein the electrode contact portion is coupled with the one end of the connection portion, wherein the electrode contact portion protrudes from the housing surface in the board insertion opening, wherein the electrode contact portion is deformable so that a connection angle between the connection portion and the electrode contact portion is changed so as to generate a contact pressure with respect to a corresponding contact electrode when the electric circuit board is inserted into the board insertion opening of the housing, and wherein each of the first inner wall and the second inner wall of the board insertion opening includes a convexity for supporting a corresponding electrode contact portion so that the connection angle between the connection portion and the electrode contact portion is constant.

9. A method for assembling the card edge connector according to claim 1, wherein each junction terminal includes a harness terminal contact portion, a connection portion and an electrode contact portion, wherein the harness terminal contact portion is disposed in the housing and extends from a housing surface of the housing to the harness terminal, wherein the connection portion is connected to one end of the harness terminal contact portion, which is disposed on the housing surface, wherein the connection portion extends from the one end of the harness terminal contact portion to one end of the connection portion along with the housing surface, wherein the one end of the connection portion is disposed in the board insertion opening, wherein the electrode contact portion is coupled with the one end of the connection portion, wherein the electrode contact portion protrudes from the housing surface in the board insertion opening, wherein the housing is made of resin, and formed by an injection molding method, wherein the housing further includes a fine hole and a terminal insertion opening, wherein the harness terminal is inserted into the terminal insertion opening, wherein the fine hole extends from the housing surface to the terminal insertion opening, the method comprising:

press-inserting the harness terminal contact portion into the fine hole in such a manner that a part Of the harness terminal contact portion is disposed in the terminal insertion opening;

inserting the harness terminal into the terminal insertion opening; and inserting the electric circuit board into the board insertion opening.

10. The method according to claim 9, wherein the press-inserting the harness terminal contact portion includes forming a tab on the one end of the harness terminal contact portion, and wherein the tab applies pressure to the harness terminal contact portion, the method further comprising:

removing the tab from the one end of the harness terminal contact portion after the press-inserting the harness terminal contact portion.

11. The method according to claim 9, further comprising:

forming a barb having a tapered shape on a part of the harness terminal contact portion, which is inserted into the fine hole, wherein the fine hole includes an inner wall having a protrusion, which is engaged with the barb.

12. The method according to claim 9, further comprising:

forming an assembled seal member for sealing a clearance between the housing and each harness, wherein each of the first harness terminals and the second harness terminals includes a body portion and a contact portion, wherein the body portion has a columnar shape, wherein the contact portion is disposed in the body portion, wherein the contact portion is elastically deformable so that the contact portion press-contacts with a corresponding electrode contact portion with a predetermined contact pressure, and wherein the harness terminal penetrates the assembled seal member so that the harness terminal is inserted into the terminal insertion opening.

13. A method for assembling the card edge connector according to claim 1, comprising:

forming the housing from resin by an injection molding method so that the junction terminal is insert-molded in the housing;

inserting the harness terminal into the terminal insertion opening; and inserting the electric circuit board into the board insertion opening.

14. The method according to claim 13, further comprising:

forming an assembled seal member for sealing a clearance between the housing and each harness, wherein each of the first harness terminals and the second harness terminals includes a body portion and a contact portion, wherein the body portion has a columnar shape, wherein the contact portion is disposed in the body portion, wherein the contact portion is elastically deformable so that the contact portion press-contacts with a corresponding electrode contact portion with a predetermined contact pressure, and wherein the harness terminal penetrates the assembled seal member so that the harness terminal is inserted into the terminal insertion opening.

* * * * *